United States Patent
Kojima

(10) Patent No.: US 7,363,571 B2
(45) Date of Patent: Apr. 22, 2008

(54) DATA PROCESSING METHOD AND APPARATUS, RECORDING MEDIUM, REPRODUCING METHOD AND APPARATUS USING THE SAME METHOD

(75) Inventor: Tadashi Kojima, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/562,666

(22) Filed: Nov. 22, 2006

(65) Prior Publication Data

US 2007/0101235 A1    May 3, 2007

Related U.S. Application Data

(60) Continuation of application No. 11/535,443, filed on Sep. 26, 2006, which is a division of application No. 10/765,848, filed on Jan. 29, 2004, now Pat. No. 7,124,345, which is a division of application No. 09/804,242, filed on Mar. 13, 2001, now Pat. No. 6,718,510.

(30) Foreign Application Priority Data

Aug. 25, 2000   (JP)   ............................. 2000-255463

(51) Int. Cl.
    *H03M 13/00*    (2006.01)
(52) U.S. Cl. .................................................... 714/755
(58) Field of Classification Search ................ 714/755, 714/746, 800
    See application file for complete search history.

(56) References Cited

U.S. PATENT DOCUMENTS

| 5,386,425 A | * | 1/1995 | Kim .......................... 714/755 |
| 5,790,569 A | | 8/1998 | Kojima et al. |
| 6,158,038 A | | 12/2000 | Yamawaki et al. |
| 6,311,304 B1 | * | 10/2001 | Kwon ........................ 714/755 |
| 6,357,030 B1 | | 3/2002 | Demura et al. |
| 7,003,711 B2 | | 2/2006 | Noda et al. |

FOREIGN PATENT DOCUMENTS

| EP | 0 481 752 | 4/1992 |
| EP | 0 674 395 | 9/1995 |
| EP | 0 766 245 | 4/1997 |
| JP | 4-154222 | 5/1992 |
| JP | 8-213918 | 8/1996 |
| JP | 9-293331 | 11/1997 |
| JP | 10-172243 | 6/1998 |

OTHER PUBLICATIONS

ECMA Standardizing Information and Communication Systems, No. 272, 2nd Edition, XP-002186767, pp. 1-99, "120 MM DVD Rewritable Disk (DVD-RAM)", Jun. 1999.

* cited by examiner

*Primary Examiner*—Shelly A Chase
(74) *Attorney, Agent, or Firm*—Oblon, Spivak, McClelland, Maier & Neustadt, P.C.

(57) ABSTRACT

A burst error-correcting capability is largely improved. At least the even-number row and at least the odd-number row of the data block which is a set of data sectors are separated. An outer parity is created for each column and an inner parity is created for each row. Then, the outer parity is scattered with respect to each of the sectors of the data block to be interleaved.

3 Claims, 18 Drawing Sheets

US 7,363,571 B2

DATA PROCESSING METHOD AND APPARATUS, RECORDING MEDIUM, REPRODUCING METHOD AND APPARATUS USING THE SAME METHOD

CROSS-REFERENCE TO RELATED APPLICATIONS

This application is based upon and claims the benefit of priority from the prior Japanese Patent Application No. 2000-255463, filed Aug. 25, 2000, the entire contents of which are incorporated herein by reference.

BACKGROUND OF THE INVENTION

The present invention relates to a data processing method and apparatus, and a recording medium for an error-correcting product code favorable for use in the recording and transmission of digital data.

More particularly, the present invention relates to a data processing system using an error-correcting product code which comprises an error-correcting outer parity and an error-correcting inner parity which are effective in the case where information data is recorded on a plurality kinds of recording media particularly having a largely different recording density. Here, particularly, in a method for forming the outer parity, a PO series creation by n sets of data items aggregated by n rows is used. Consequently, even when the error-correcting product code block is recorded on a recording medium in an order of data transmission without carrying out data interleave process; the capability of coping with the defect is largely improved.

In a system in which digital data is recorded on an optical disk by bytes (one byte is equal to eight bits) or digital data is transmitted to a transmission channel, a Reed-Solomon error-correcting product code block is constructed to process data. That is, (M×N) bytes of data is arranged in a matrix containing an M rows×N columns. Then, PO bytes error-correcting word is added to each column of M bytes information portion. Then, PI bytes of error-correcting words are added to each row of N bytes information portion. Then, (M+Po) rows×(N+Pi) columns Reed-Solomon error-correcting product code block is constructed. Then, this Reed-Solomon error-correcting product code block is either recorded on a recording medium or transmitted to a transmission channel. The error-correcting processing portion on the information reproduction side of the recording medium and the receiving side of the transmission channel are capable of correcting random errors and burst errors on the information portion by using the error-correcting words PO and PI.

Such Reed-Solomon error-correcting product code block has a higher data processing efficiency with a decrease in a ratio of a redundant portion (Pi×M+Po×N+Po×Pi) of the error-correcting word with respect to the whole word referred to as redundancy ratio, namely (M+Po)×(N+Pi). On the other hand, the error-correcting capability is also heightened with respect to the random error and the burst error with an increase in the Pi and Po.

Here, it is known that the Reed-Solomon error-correcting code block having small M and N, namely small Pi and Po has a lower correcting capability because of relatively higher probability of error in error correction in the case where the Reed-Solomon error-correcting product code blocks having the same redundancy ratio are compared with each other.

On the contrary, it is known that since Pi and Po can be increased at the same redundancy ratio with an increase in M and N, a high error-correcting capability can be obtained. However, such capability cannot be realized unless the constraint conditions described below are satisfied.

A first constraint condition is that M+Po and M+Pi must be equal to or less than 255 bytes as a code length for constructing the Reed-Solomon error-correcting product code block (in the case where the length of the code is eight bits). Incidentally, Pi described above refers to the PI series error-correcting code length while Po refers to the PO series error-correcting code length.

A second constraint condition is a cost constraint resulting from the scale of the hardware.

By the way, when considered on the basis of the above conditions, optical disk standards such as a DVD-ROM, a DVD-RAM, a DVD-R or the like which are the information recording media in recent years are made public as a standard in which the improved Reed-Solomon error-correcting product code block is adopted. Out of these standards, the DVD-ROM and the DVD-RAM are established as DIS16448 (DVD-ROM having a diameter of 80 mm) and DIS16449 (DVD-ROM having a diameter of 120 mm) and DIS16825 (DVD-RAM).

In this DVD standard, the above idea is adopted with respect to the error-correcting word processing method so that the error-correcting capability is remarkably improved with error-correcting word having a small redundancy ratio as compared with the method used in the conventional optical disks.

The concept on the error-correcting method of the DVD is basically described above, the fundamental problem is to what level the target of the random error-correcting capability and the burst error-correcting capability is to be set. In order to set such level, the recording method of the recording medium and the generation of defects resulting from the handling thereof must be considered.

The recording/reproducing method is determined from the recording/reproducing beam spot size resulting from the recording wavelength and the optical system characteristic in the optical disk system. Here, the recording density constitutes a large factor in the determination of the error-correcting method. In particular, in the determination of the burst error correction capability, the defect length such as scratches or the like generated in the handling of the discs can be determined from experience. With respect to the error-correcting capability, the multiplication of line recording density by the physical defect length constitutes a burst error length of information data with the result that the error correcting capability is required to be raised in the improvement of the recording density.

The recording density can be described as follows with particular reference to the reproduction system.

When, a light source wavelength is denoted by $\lambda$, and a numeric aperture of an object lens is denoted by NA, the recording density stands proportional to $(NA/\lambda)^2$. The wavelength adopted in the DVD is 650 nm while NA is 0.6.

In the error-correcting method, a row side inner parity of RS (182, 172, 11) and a column side outer parity of RS (208, 192, 17) are adopted by means of PI (inner parity)=10 bytes and PO (outer parity)=16 bytes respectively with respect to the (M×N)=(192×172) bytes information data block in terms of the Reed-Solomon error-correcting product code (RS is referred to as Reed-Solomon). The block used in this error-correcting method is referred to as the error-correcting product code block.

Here, with respect to the error-correcting product code block, the error is corrected in the PI series at first, and an error mark is attached to a row whose error cannot be corrected. Thereafter, at the time of the error correction on the PO series, the error mark is treated as an error position. When the so-called "erasure correction" method for calculating and extracting only error patterns is used, a maximum of 16 rows of burst errors can be corrected. In the DVD, since the recording density is data bit length=0.267 μm, 0.000267×8×182×16=6.2 mm is given. It is possible to say that about 6 mm burst error-correcting capability is given.

However, as a next generation DVD an examination is started on an optical disk having a large capacity resulting from further increase in the density. For the increase in capacity exceeding the DVD, the recording density must be increased. Recently, in order to meet such request, a blue laser diode having a wavelength of 450 nm is made public. When such laser diode is used, it is expected that the recording density can be improved by about 2.6 times in the optical system similar to the DVD or the like. With the improvement in the optical system, four to five times higher density can be realized so that a fine image such as a high definition image such as a Hi-Vision or the like can be recorded for two or more hours on one disc.

In such increase in the density (for example, the line density is about twice as compared with the conventional one), only about 3 mm error-correcting capability can be provided with respect to the burst error when the conventional error-correcting method is introduced.

Furthermore, as described above, the error-correcting word length is 255 bytes at most as long as 1 word=8 bit system processing system is used. Since the PO series is 208 bytes in the DVD standard, the burst error correcting capability is close to the limit in the above error-correcting method so that only little improvement can be expected.

In order to expand the error-correcting word length, the word length may only be lengthened. With respect to the word length, a multiple of eight can be easily used. As a consequence, 1 word=16 bits can be considered. The scale of the error-correcting circuit as hardware is extremely large as compared with the conventional one so that there arises many problems.

In such a case, there is generally available a technique in which the burst error-correcting capability is improved while maintaining the error-correcting code length by adopting a data interleave to scatter the burst error.

However, the data interleave is not adopted even in the DVD standard. The reason goes as follows: in the case where an error is created which exceeds the error-correcting capability in the reproduction processing in the case of an image signal in which information data is compressed, the error data is scattered with the result that a disadvantage of the reproduced image is generated at many positions. In the reproduction processing of the image signal, it is thought that processing of concentrating and reproducing disadvantageous images as much as possible is favorable as a processing of generated disadvantage. This is because the processing can be completed with the reproduction of an instant disadvantageous image.

Besides, a structure close to the current DVD system is favorable for the upper compatibility with respect to the next generation system.

Points Noted by the Inventors of the Present Invention

Generally, in the error-correcting processing method such as a package medium or the like, the Reed-Solomon product code block method is introduced in many cases. This is because high performance and high efficiency can be expected with this method in the case where defect error data such as defects generated in package medium or the like is detected and corrected.

With respect to the unit of processed data, 1 word=1 byte (8 bits) is favorable. When the application development of the system is considered, it is required to suppress a processing circuit to an appropriate hardware scale. Besides, this fact is required for facilitating a connection to the recording medium and the transmission channel because a front and rear processing circuit is provided in the recording on the recording medium and data transmission to the transmission channel in addition to the error-correcting processing.

Under these circumstances, use of the Reed-Solomon error-correcting product code block used in the current DVD is optimal as an error-correcting method which can corresponds to a large improvement in the recording density of the recording medium under the above surrounding situation.

row side inner parity RS (182, 172, 11)
column side outer parity RS (208, 192 17)

Here, the problem is that it is required to settle the improvement of the burst error correcting capability.

In order to heighten the burst error correcting capability, the error may only be scattered in the error detecting and correcting capability in each of the correction code. However, an image and an acoustic signal as information data are subject to compression coding. In a system for recording and reproducing the compression signal, a data structure or error-correcting processing system is desirable which is capable of suppressing information breakdown to a minimal level in the final reproduction of the image and acoustic signal.

In particular, as countermeasures for dealing with the burst error, the number of errors in one error correction block is decreased by scattering the error signal, so that the error-correcting capability can be improved. However, in the case where errors are present in the number exceeding the error-correcting capability, the dispersion of the error signal will result in the expansion of the damage done on the whole data. Consequently, it is difficult to adopt the method using the error data dispersion, namely, the data interleave, which constitutes the basic concept of heightening the burst error-correcting capability.

BRIEF SUMMARY OF THE INVENTION (1) Therefore, an object of the present invention is to provide a data processing method and apparatus and a reproducing method and apparatus, wherein the creation of an outer parity is devised which directly affects a burst error-correcting capability.

(2) Furthermore, an object of the present invention is to provide a data processing method and apparatus and a reproducing method and apparatus which can largely improve a burst error-correcting capability even in a correction flag redundancy ratio which is the same as the conventional one in an error-correcting method based on byte data.

(3) Furthermore, an object of the present invention is to provide a data processing method and apparatus and a reproducing method and apparatus which are capable of realizing an error-correcting process on a high-density optical disk using a blue laser having a short wavelength up to a physical error-correcting length larger than the conventional one.

(1A)

That is, in the first method of the present invention, one matrix block is such that a plurality of M rows×N columns data sectors are aggregated and formed. Furthermore, sub-blocks each having the same number of Y rows is such that one matrix block is divided and formed. Furthermore, Y error-correcting word blocks PO-1 through PO-y are created with respect to the data in the row (vertical) direction of Y sub-blocks. Then, one error-correcting code block (ECC block) is such that Y error-correcting word PO-1 through PO-y are scattered and arranged in bytes at the end of each row. Furthermore, at the end of each row, a configuration is formed such that an error-correcting word PI in the column (horizontal) direction is added at the end of each block.

Then, the present invention provides either a data processing method or apparatus characterized by constructing the ECC block, or the present invention provides a recording medium in which such ECC block is recorded. Furthermore, the present invention provides a method and an apparatus for reproducing the matrix block by processing such ECC block.

Specifically, for example, in the beginning, a main block is constructed which has larger than the maximum byte numbers (=255 bytes) and has twice as many as rows, the block being constructed as a code length in the Reed-Solomon code in which 8 bits=1 bytes are set as data unit.

Then, for example, an even-number row and an odd-number row of the main block are separated to construct two sub-blocks. An outer parity is created for each row separately in each block. The inner parity is created in each of the rows like the prior art.

(2A)

Furthermore, in another method of the present invention, one error-correcting code block (ECC block) is such that Y error-correcting word blocks PO-1 to PO-y are scattered and arranged in bytes at the end row of the data sector. Furthermore, this error-correcting code block has a configuration such that an error-correcting word PI in the column (horizontal) direction is added at the end of each row.

Then, the present invention provides either a data recording method or apparatus characterized by constructing the ECC block, or a recording medium on which such ECC is recorded. Furthermore, the invention provides a method and apparatus for reproducing the matrix block by processing such ECC block.

Specifically, for example, in the beginning, a main block is constructed which has larger than the maximum byte numbers (=255 bytes) and has twice as many as rows, the block being constructed as a code length in the Reed-Solomon code in which 8 bits=1 byte are set as data unit. Then, for example, in a first sub-block comprising an even-row of the former half area of the main block and an odd-row of the latter half area of the main block, and a second sub-block comprising an odd-row of the former half area of the main block and an even-row of the latter half area of the main block an outer parity is separately created for each of the rows. Furthermore, an inner parity of each of the first and the second sub-block is created in each of the rows in the conventional manner.

When a varied error-correcting code block as described above is adopted, the error data is constructed in a scattered manner as seen from the error-correcting system of the outer parity. There is realized a structure in which actual recording and transmission data observes the actual data order so that no error dispersion is generated at the decoding time.

That is, in the error-correcting method using the conventional error-correcting code block, an outer parity and an inner parity are created and odd to A rows×B columns data block. However, in the present invention, as the number of rows of the data block, the number of rows is adopted which is larger than the number of rows of the maximum code length which can be subjected to error coding. The error-correcting code series (PO series) in the row (vertical) direction is divided into two sets. As a consequence, it becomes possible to deal with a data block larger than the conventional one as an error-correcting code block. Furthermore, it also becomes possible to not to scatter the data transmission order which is important in dealing with a compressed image signal or the like so that a burst error-correcting capability can be largely improved.

As described above, in the error-correcting word comprising a product code in which, for example, 8 bits=1 byte constitutes a data unit, it is required that the number of rows and the number of columns are selected so that the byte number of the block in which the information data and the error-correcting word are odd becomes 255 bytes×255 bytes.

However, generally the information data basically takes a sector structure in which the data amount obtained by adding an ID (Identification Data) and a certain amount of control signal are odd to the data having 512 bytes, 1024 bytes, 2048 bytes, 4096 bytes or the like. Thus, a plurality of sets of such sectors constitute an error-correcting block. Furthermore, numeric values such as 8, 16, and 32 suitable for binary processing is favorable as the number of sectors in the error-correcting blocks for taking a good timing with other signal processing. When such condition is added, the number of rows and the number of columns are limited so that the number of rows and the number of columns become about 200. As one of such example, in the structure in which the conventional DVD standard is adopted, 172 bytes×12 bytes configures one data sector, and 16 sectors are clustered to configure a data block.

Here, 16 bytes outer parity is generated with respect to the data of each column (12×16=192 bytes) to scatter and add the outer parity to each row (16) by one byte. As a consequence, 16 sector data block is configured which is a set of (12+1) rows×172 bytes block (one sector)

Here, furthermore, 10 bytes inner parity is created with respect to (12+1) rows×(172+10) rows error-correcting block. 172×12 bytes one data sector is such that ID, 12 bytes control signal and 4 bytes error sensing code EDC are inserted into the 2048 bytes main data. Consequently, a product code block can be realized which has a very small redundancy ratio and which enable very efficient detection and error.

However, increasing the number of rows in the row (vertical) direction is limited as it is, and it is impossible to improve the error-correcting capability with burst characteristic without raising the redundancy ratio.

Then, according to the present invention, the error-correcting block in the DVD standard is set to two blocks unit. The even-number row and the odd-number row are separated and handled to create an error-creating word PO in each row direction of the even-number row and the odd-number row. As a consequence, the burst error-correcting capability can be improved by two times. The error-correcting block is set to 32 blocks unit. However, the method of the present invention can be used by somewhat correcting the data reading order of the conventional DVD error-correcting method. Furthermore, there is an advantage in that the data processing in the conventional sector unit can be used so that the method can bee linked to the application standard used in the DVD as it is.

The present invention can be described in the following manner in terms of the constituent element.

(1B)

According one embodiment of the present invention, there is provided a data processing method characterized in that:

digital data is processed in bytes to constitute one information data block in (M×N) bytes of M rows×N columns;

data is arranged in bytes in the information data block, so that data is arranged in the data transmission order from the 0th column to the (N−1)-th column for each row while data is arranged in the data transmission order from the 0th row to the (M−1)-th row;

(K×M) rows×N columns matrix block is further arranged which is a set of the information data block, and which is constituted of K information data blocks composed of information data blocks from the 0-th information data block to the (K−1)-th information data block which continue in the data transmission order;

on each column of (K×M) bytes of the matrix block, an error-correcting word PO-a (K×Q) or PO-a ((K/2)×Q) bytes is created at least with respect to only even-number data (K×M/2) bytes, and an error-correcting word PO-b (K×Q) or PO-b ((K/2×Q) bytes is created at least with respect to only odd-number data (K×M/2) bytes;

PO-a and PO-b are scattered and arranged into K information data blocks which is constituted of (M×N) bytes of M rows×N columns;

each column of N columns is formed as (K×(M+Q)) or (K×(M+2Q)) bytes of Reed-Solomon code PO (Q is an integer of 1 or more); and the error-correcting word P bytes is further added for each row of N bytes and each row of (K×(M+Q)) or (K (M+2Q)) rows is formed as (N+P) bytes Reed-Solomon code PI;

whereby as an overall block, an error-correcting product code block is realized which constitutes (K×(M+Q))×(N+P)) or (K×(M+2Q))×(N+P)) bytes Reed-Solomon error-correcting word having K information data block of (K×M×N) bytes as information portion.

According to the present invention, an error-correcting code block is constituted wherein the sum of one information data block of (M×N) bytes and an average word bytes added to the data block becomes a definite value (M+Q)× (N+P) or (M+2Q)×(N+P).

(2B)

According one embodiment of the present invention, there is provided a data processing method comprising:

digital data is processed in bytes to constitute one information data block in (M×N) bytes of M rows and N columns;

data is arranged in bytes in the information data block, so that data is arranged in the data transmission order from the 0th column to the (N−1)th column for each row while data is arranged in the data transmission order from the 0th row to the (M−1)th row;

(K×M) rows×N columns matrix block is further constructed which is a set of the information data block, and which is constituted of K information data blocks composed of information data blocks from the 0th information data block to the (K−1)th information data block which continue in the data transmission order;

on each row of (K×M) bytes of the matrix block, an error-correcting word PO-a{(K/2)×Q bytes} is created with respect to the (k/2)×(mi+mj) bytes which is constituted by aggregating the even-number rows and the odd-number rows specified in the K information data block order, and an error-correcting word PO-b {(K/2)×Q bytes} is created with respect to the (K/2)×(mj+mi) bytes which is constituted by aggregating the remaining even-number rows and the odd-number rows specified in the K information data blocks;

the PO-a and the PO-b are scattered and arranged into the K information data blocks composed of (M×N) bytes of M rows×N columns;

each column of N columns is formed as two sets of Reed-Solomon code PO of (K/2)×(mi+mj)+Q) bytes and (K/2)×(mj+mi)+Q) bytes (however, M=mi (the number of even-number rows)+mj (the number of odd-number rows) and (Q is an integar of 1 or more); and the error-correcting word of P bytes is further added for each row of N bytes;

whereby as an overall block an error-correcting product code block is realized which constitutes (K×(M+Q)×(N+P)) or (K×(M+2Q))×(N+P)) bytes Reed-Solomon error-correcting word having K information data block of (K×M×N) bytes as information portion.

As a consequence, two sets of Reed-Solomon codes P on each row in the column direction constitute an error-correcting product code in which rows constituting respective code series are alternately arranged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
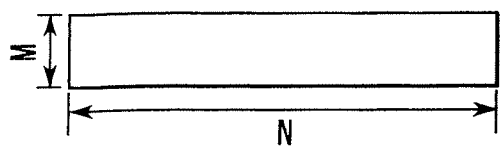
FIG. 1 is a view showing a (M×N) bytes of information block.

Hereinafter, referring to the accompanying drawings, embodiments of the present invention will be explained.

In a structure of an error-correcting information data block in which an error-correcting code is created and added to the information data block, the Reed-Solomon error correction is used many times for heightening the random error and burst error correction capability. Furthermore, generally, in the digital data processing, a unit of 8 bits constitutes one byte. In consideration of other aspects of the development, such concept is favorable in the data processing efficiency.

Hereinafter, a detailed explanation will be given by referring to the drawings and the DVD standard.

FIG. 1 is an M row×N columns information data block. In the field of computers, 128×(multiple of 2) is used as processed information data block.

In the DVD standard, 2048 bytes are used an information block unit. By adding ID and a control code or the like to 2048 bytes main data, 2064 bytes is set to constitute 12 rows×172 columns information data block. When an attempt is made to gain an expected error-correcting capability by directly adding an error-correcting code to (M×N=12×172) byte block, the redundancy ratio of the correction code becomes too high. Then, (K×(M×N)) bytes information data block is constructed by aggregating K information data blocks.

Figure 2:
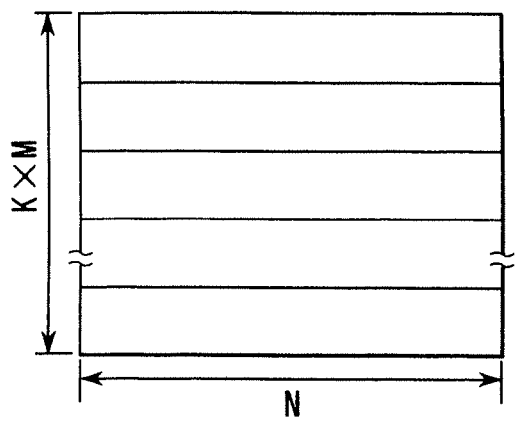
FIG. 2 is a view showing a structure of (K×(M×N)) when k pieces of the (M×N) bytes information blocks are aggregated.

FIG. 2 is a view showing this (K×(M×N)) bytes information data block. In the DVD standard, K=16 is adopted.

The row (vertical) direction in the information data block is the (K×M) bytes data. In the (K×M) byte data in each of the N rows, (K×Q) bytes error-correcting code is created and added. Next, the row (vertical) direction in the information data block of FIG. 2 is N bytes data. Furthermore, the row number is (K×M)+(K×Q) row because of an increase in the previous error-correcting code (K×Q). In each of the (K×M)+(K×Q) row, P bytes which are error-correcting code is created and odd.

Figure 3:
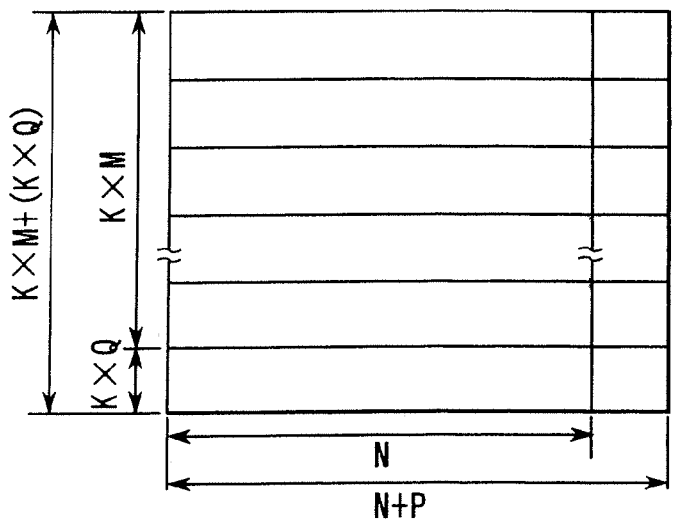
FIG. 3 is a view showing a structure of a correction block in which the error-correcting code is added to the (K×(M×N)) code in the product code structure.

FIG. 3 is a view showing a state in which (K×Q) bytes error-correcting code and P bytes error-correcting code are added to (K×(M×N)) information data blocks.

In the DVD standard, Q=1 and P=10 are given.

Next, (K×Q) bytes error-correcting code is scattered by Q bytes and is odd to K (M×N) bytes information data blocks respectively so that each of the information data blocks assumes the same configuration.

The processing is significant in that all the K information data blocks are formed in the same structure. That is, (N×M) bytes information data is odd with ID showing an address of the information data. However, since the error-correcting code (K×Q×172) which is an outer parity PO is all error-correcting code, the ID cannot be added thereto. Then, this error-correcting code is scattered and arranged in each of the information data block so that all the information data blocks assume the same structure and have the ID.

Incidentally, the order of scattering and arrangement is such that (K×Q) row is scattered and arranged in each information data block after creating the error-correcting code in the row (vertical) direction. Otherwise, after an error-correcting code in the row (horizontal) direction is created and added to each row, the error-correcting code in the column (horizontal) direction is created and added to each row, the error-correcting codes of (K×Q) rows in the row (vertical) direction are scattered and arranged on each information data block. In any order, the method of the DVD standard yields the same result.

Figure 4:
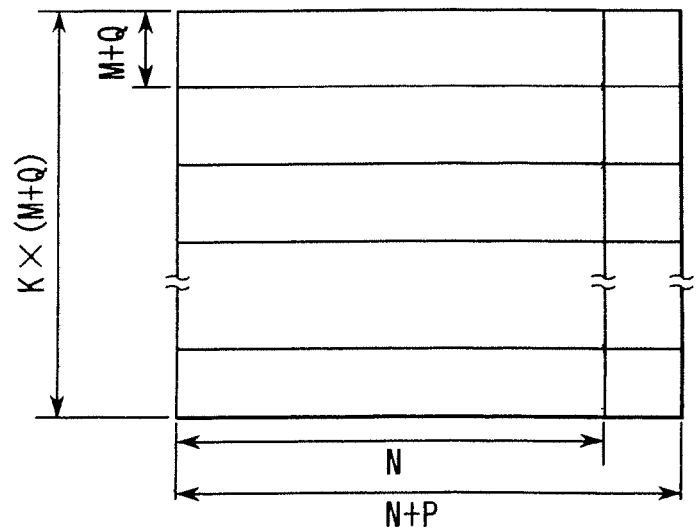
FIG. 4 is a structure of the correction block in which the error-correcting word PO (K×Q) is added to each of the information data block in Q bytes so that the information block added with a correction flag has the same structure.

FIG. 4 is a view showing a new block structure in which (K×Q) rows of the error-correcting words are scattered and arranged in each of K information data blocks by Q. In the DVD standard, (K×(M+1)×(N+P)), namely, [16×(208×182)] bytes error word block is constructed.

Figure 5:
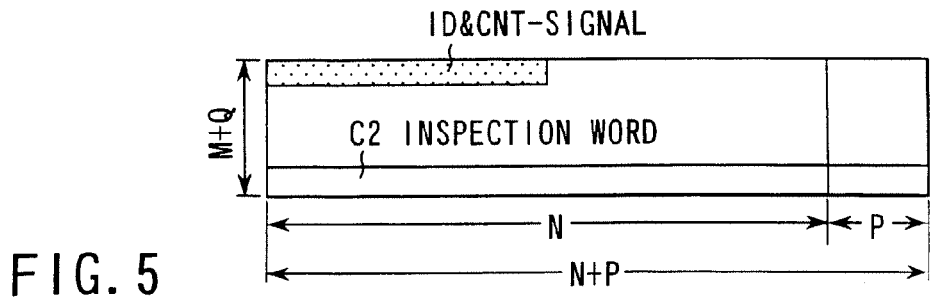
FIG. 5 is a view showing a structure of information data block added with the error-correcting code of FIG. 4.

FIG. 5 is a view showing a structure of one information data block (M+Q)×(N+P) to which the error-correcting code is added. On the front row, an ID and a control signal (CNT-sig) which constitute address information of the information data block is arranged while the error-correcting word Q in the row (vertical) direction is arranged at the end row. In the DVD standard, Q=1 is set, and in this structure, the number of K can be increased until K×(M+Q) becomes 255.

Figure 6:
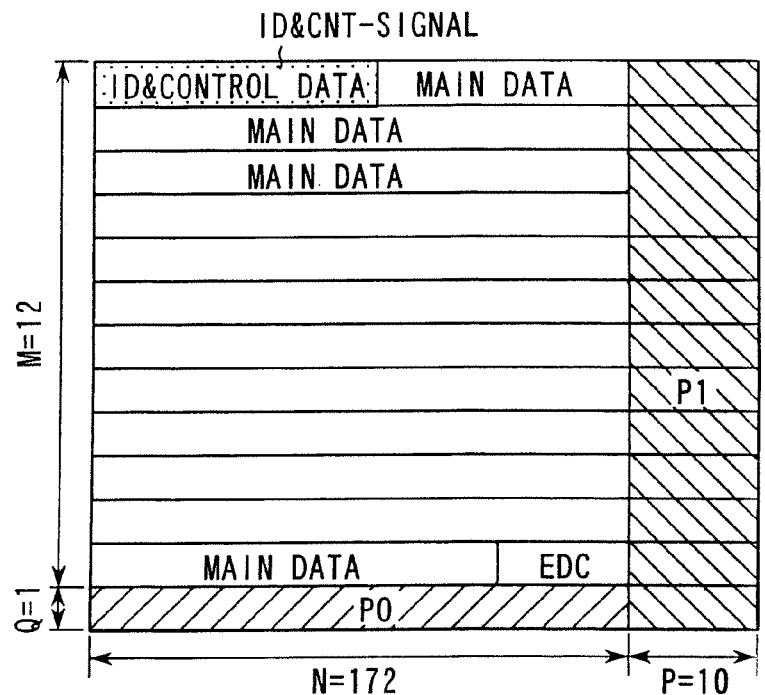
FIG. 6 is a view in which a structure of the information data block of FIG. 5 is shown in the code length used in the DVD standard.

FIG. 6 is a view showing in detail the information data block of FIG. 5. At the last of the main data, the EDC is added.

Figure 7:
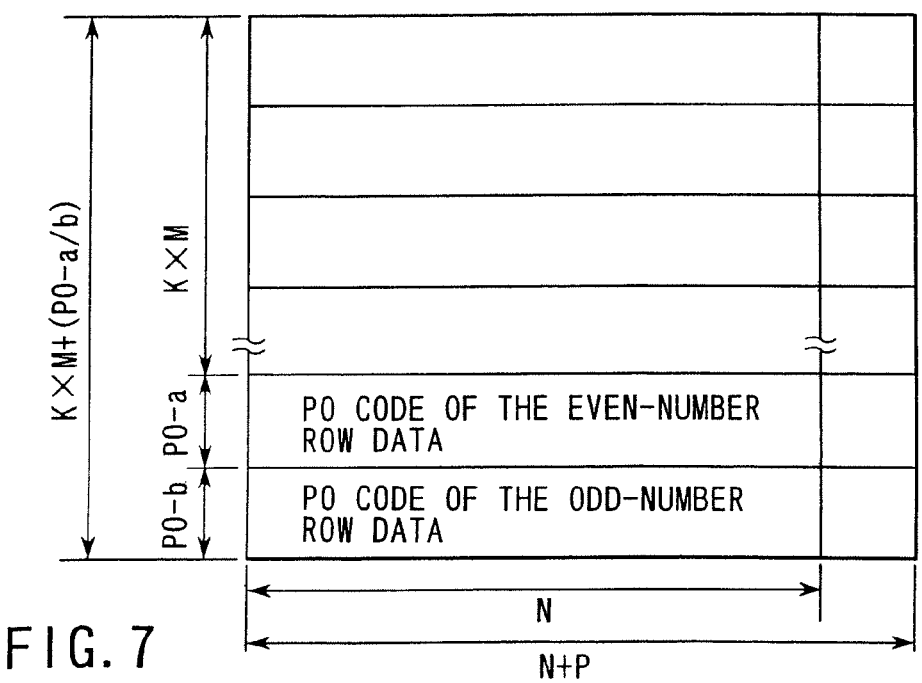
FIG. 7 is a view showing one example of a structure of the error-correcting block according to the present invention.

FIG. 7 is a view showing one embodiment of the information data block according to the present invention.

N columns×M rows of K information data blocks as shown in FIG. 1 are aggregated so that (K×M) rows×N columns matrix blocks shown in FIG. 2 are constructed. Here, (K×Q) bytes or (K/2×Q) bytes error-correcting code (error-correcting word) PO-a is created with respect to (K×M/2) bytes data on each column of the even-number row.

Next, (K×Q) bytes or (K/2×Q) bytes error-correcting code (error-correcting word) PO-a is created with respect to (K×M/2) bytes data on each column of the odd-number row.

PO-a and PO-b created here are scattered and located on each of (M×N) bytes of K information data blocks are scattered and arranged.

Here, in the case of PO-a=PO-b=(K×Q), PO-a and PO-b are respectively scattered and arranged by Q on each of the (M×N) bytes information data blocks while in the case of PO-a=PO-b=((K/2)×Q), PO-a is scattered and arranged on the even-number-th information data blocks or the former half of the information data block out of K information data blocks and PO-b are scattered and arranged on the odd-number-th information data blocks or the latter half of the information data blocks.

Here, in the case where M=12 and N=172 are set in the same manner as the DVD standard of FIG. 1 according to the present invention, setting K=32(16×2), Q=1 and PO-a=PO-b=16 leads to the creation of the error-correcting word PO-a for the even number and the error-correcting word PO-b for the odd number with respect to the 172 columns×(12×32)= 384 rows of the error-correcting data block. Then, on the even number-th of each of 32 information data blocks, PO-a is scattered and arranged. On the odd number-th thereof, PO-b is scattered and arranged, so that 32 information data blocks of (12+1) bytes×172 bytes are formed. Furthermore, 10 bytes error-correcting word PI is added so that 32 information data blocks of (12+1) rows×(172+10) columns are formed. This is the error-correcting product code block.

Each of the information data blocks after the addition of the error-correcting word has the same structure as the conventional block shown in FIG. 6. However, the value of K is different. The information data block of DVD are constituted of main data 2048 bytes composed of 12 rows and 172 columns, an ID and a control signal (12 bytes), and an EDC (4 bytes). On the whole, 2064 bytes information data block constitutes a unit.

The present invention is not restricted to the above embodiment.

Figure 8:
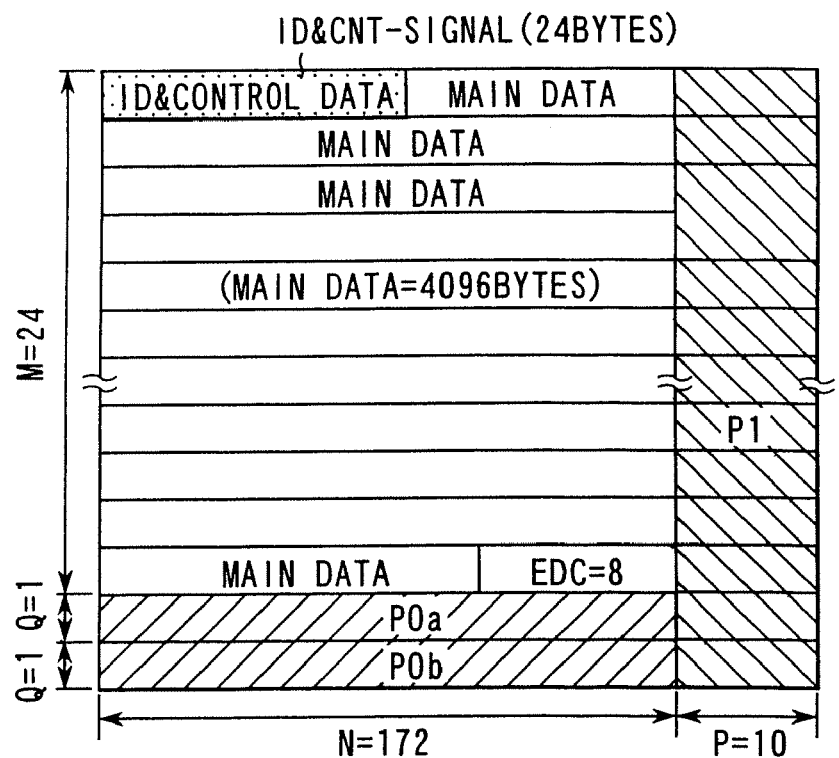
FIG. 8 is a view showing a state in which an error-correcting word PO is scattered and arranged on the (M×N) bytes information data block.

As another embodiment, an information data block is considered wherein the ID, the control signal (24 bytes) and the EDC (8 bytes) are added to (M=24 rows)×(N=172 columns)=4096 bytes main data (information block). Now when PO-a=PO-b=16 bytes is established at K=16 and Q=1, one byte is scattered and arranged to each of the information data blocks from PO-a and PO-b respectively. One information data block after adding the error-correcting word in this case assumes a structure shown in FIG. 8.

Next, the error-correcting code PI will be explained.

Figure 9:
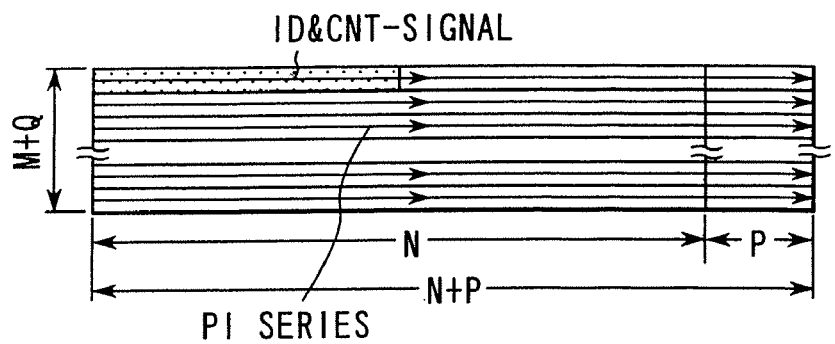
FIG. 9 is a view shown for explaining one example of the error-correcting word PI series according to the present invention.

FIG. 9 is a view showing a formation series of the error-correcting word (inner parity) which is one example of the present invention. The inner parity Pi is created with respect to the data in the column (horizontal) direction which is a data transmission order.

Figure 10:
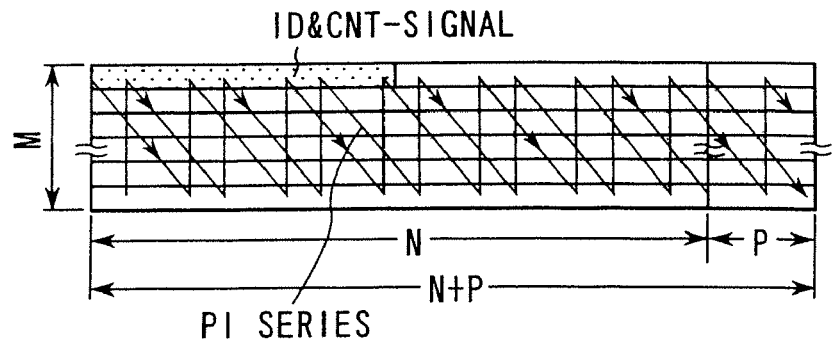
FIG. 10 is a view shown for explaining another example of the error-correcting word PI series according to the present invention.

FIG. 10 is a view showing a variation for forming an error-correcting word (inner parity) which is another embodiment of the present invention.

With respect to M rows×N columns data of the information data block, the formation of the (N+P) bytes Reed-Solomon code (inner parity) PI is realized in data from 0-th column to the ((N+P)−1)-th column and 0-th row to the (M−1)-th row. In the creation of the PI series error-correcting code with respect to the information data block to which PO is added, each row and each column are increased on the basis of the byte data of each front column to rotate and arrange the row number (M) obtained as a result of increase to move to the 0th row when the increase result of the row becomes (M)-th row thereby constituting (M) sets of PI series error code.

In the conventional recording density, one to two bytes error is scattered as a random error. However, in a high-density recording, the error is increased up to five bytes.

Then, the recording arrangement is not changed with respect to the data order by setting the error-correcting series to a data set series having a jump arrangement different from the recording order. However, since the error-correcting code series is different from the recording order, a small concentration error is scattered in the error-correcting processing so that the random error capability in the execution can be improved.

Figure 11:
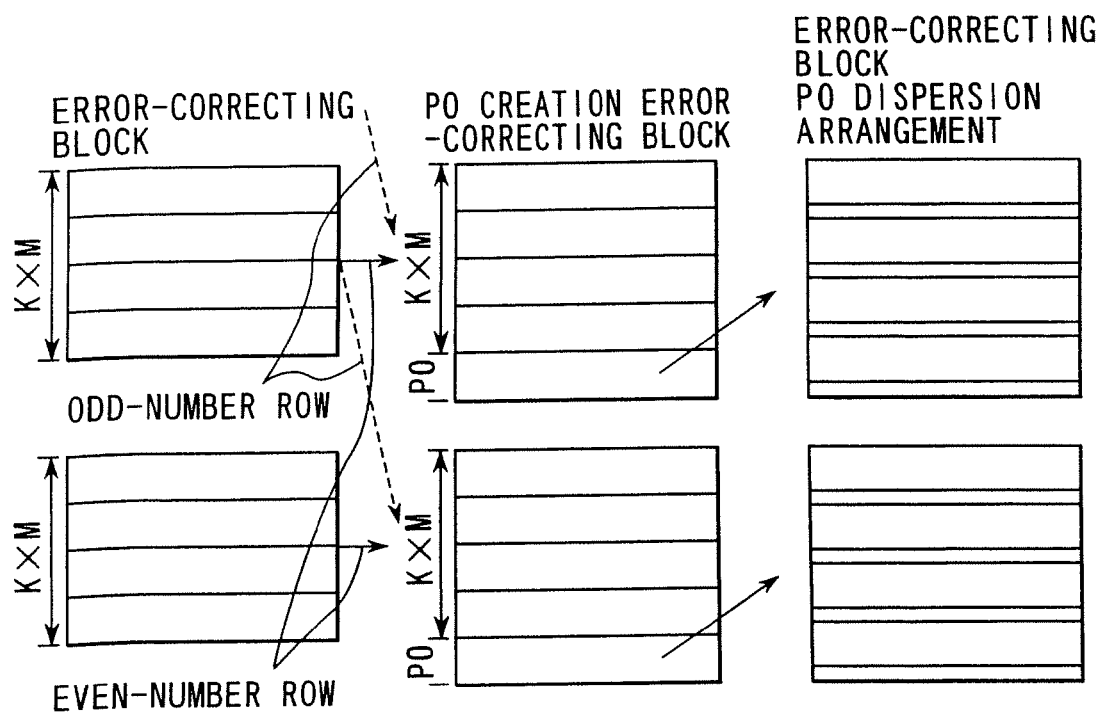
FIG. 11 is a view shown for explaining another example of the error-correcting word PO series according to the present invention.

FIG. 11 is a view showing a method for forming a PO series error-correcting code according to another embodiment of the present invention.

In FIG. 11, (K×M) rows×N columns error-correcting data block (matrix block) like the conventional DVD standard is formed in a recording order. The block B2 is a current block while the block B1 is a block before the block B2. In the creation of the PO series error-correcting data block Po, an even-number data of the current error-correcting data block is aggregated in a set to constitute a data block B22. Next, when the error-correcting code Po is created, the code is scattered and arranged in the current error-correcting data block B22 to constitute the block B23. Thereafter, to this block B23, the PI series error-correcting code Pi is created to add each row.

In this error-correcting word data processing method, PO series is subjected to an overlapping processing. However, this method has an advantage in that the required reading data scope can be small in an arbitrary two information data blocks.

Furthermore, the present invention is not limited thereto.

Figure 12:
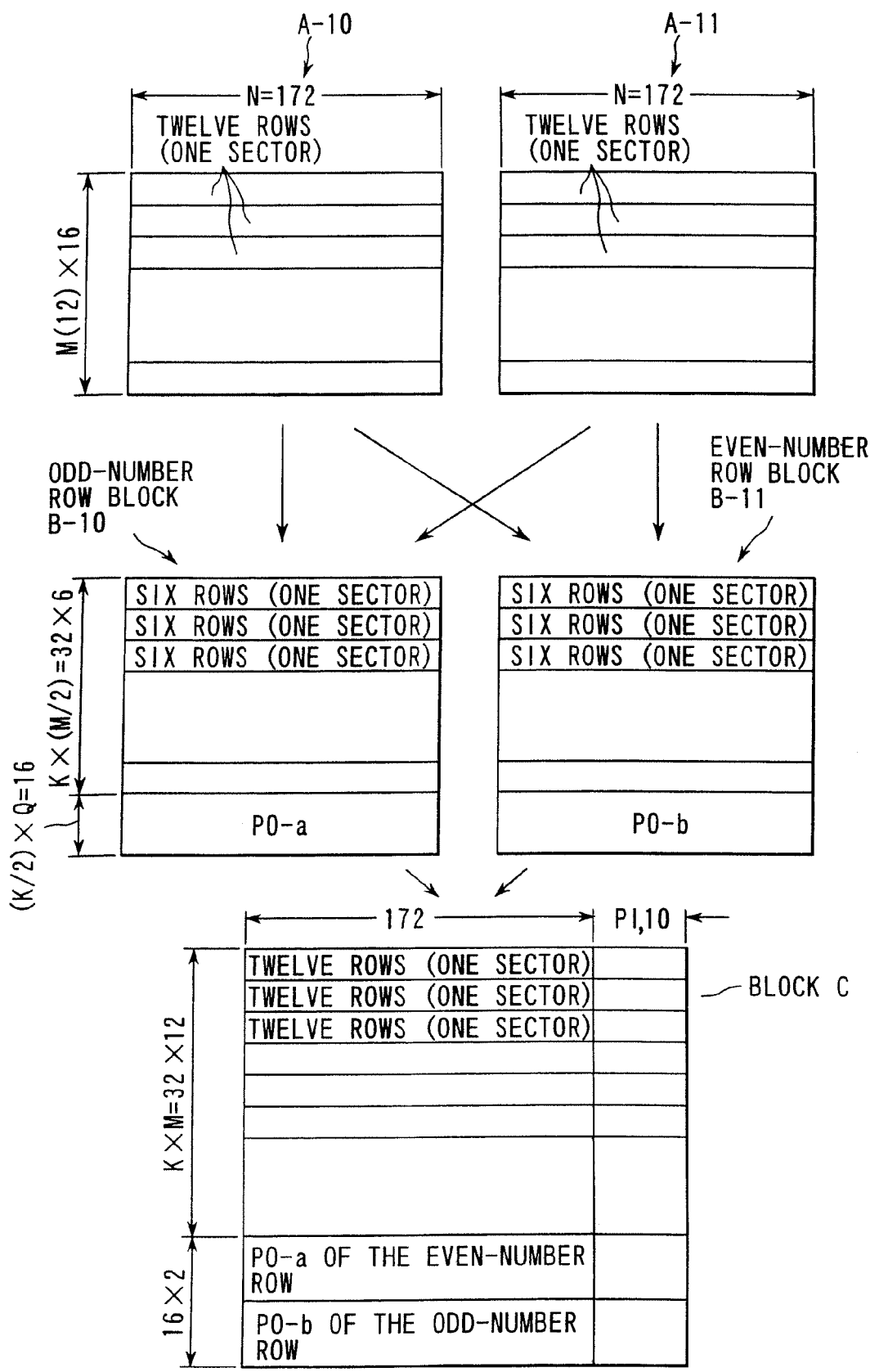
FIG. 12 is a view showing another example of a process at the time of creating an error-correcting block is created according to the present invention.

FIG. 12 is a view showing a process of creating the ECC block shown for explaining a basic concept of the present invention.

An object of the present invention is to improve the error-correcting capability in the case where the burst error is generated. For this purpose, the error-correcting processing block by the outer parity is scattered.

In explanations of FIGS. 1 and 2, the information data blocks (N×K) bytes are clustered into K (here K=16) sets. Then, an outer parity and an inner parity is added to the set data blocks to generate the ECC blocks. However, in this invention, two sets of information data blocks are used to generate the ECC block. Consequently, the number K of the information data blocks to be handled is 32 in the present invention.

FIG. 12 is a view showing a state in which two sets of information data blocks (A-10 and A11) are prepared. Next, the even-number data blocks and the odd-number data blocks (A-10 and A-11) are divided into two blocks respectively. Both the even-number blocks and the odd-number blocks are given in two blocks respectively. Hereinafter, the two blocks are referred to as even-number blocks (B-10), (B-11). With respect to the even-number block and the odd-number block, an outer parity is created and added. Hereinafter, the outer parity added to the even-number block (B-10) is denoted by PO-a while the outer parity added to the odd-number block (B-11) is denoted by PO-b. The outer parities PO-a and PO-b are referred to an error-correcting code or error-correcting word.

Here, as the byte numbers of the outer parity PO-a, (K×Q) bytes or (K/2×Q) bytes are given with respect to the (K×M/2) on each column. As the byte numbers of the outer parity PO-b, (K×Q) bytes or (K/2×Q) bytes are given with respect to the (K×M/2) on each column.

Next, the separated even-number row and the odd-number row are brought back to the original state. The state is shown as block C. This means that 32 information data blocks (M rows×N columns) are aggregated as sets. Furthermore, as the outer parity, PO-a and PO-b are added. Furthermore, an inner parity PI (10 bytes) is also created and added. Next, the PO-a and PO-b created here are scattered and arranged into K(=32) information data blocks each having (M×N) bytes.

Figure 13:
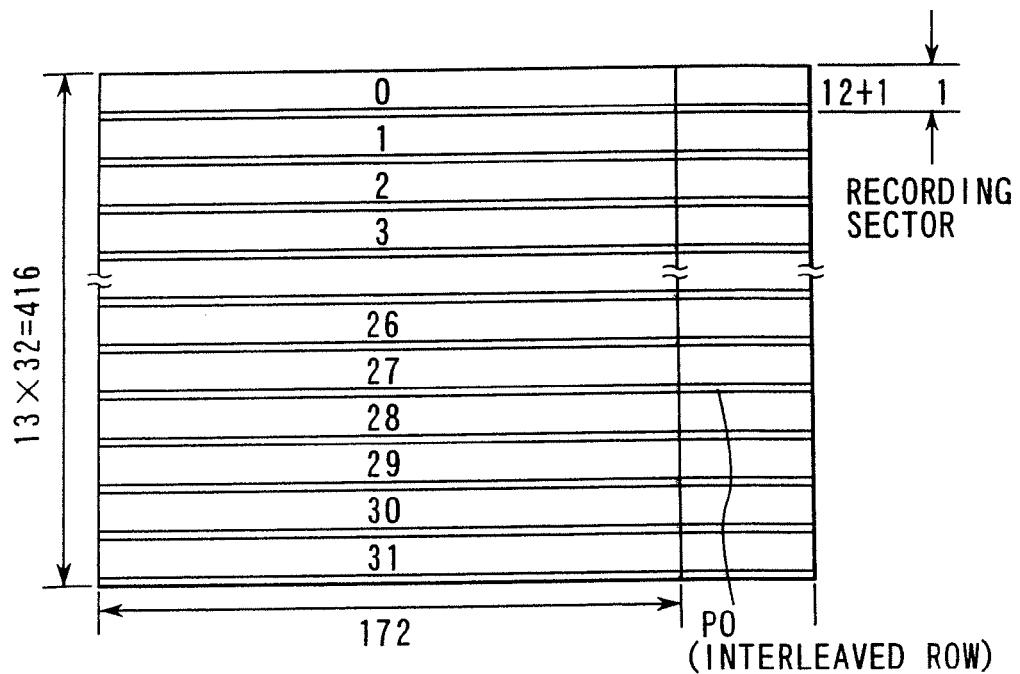
FIG. 13 is a view showing a state in which the error-correcting word is scattered and arranged on each of the information data block according to the present invention.

FIG. 13 is a view showing a state in which each outer parity PO is scattered and arranged into each information data blocks. Here, in the case of PO-a=P-b=(K×Q), information data blocks are scattered and arranged by Q bytes to each of (M×N) bytes information data blocks from PO-a and PO-b respectively. In the case of PO-a=Po-b=((K/2)×Q), PO-a is scattered and arranged into even-number information blocks, or the former half information data blocks while PO-b is scattered and arranged into the odd-number information data block, or the latter half information data blocks.

Figure 14A:
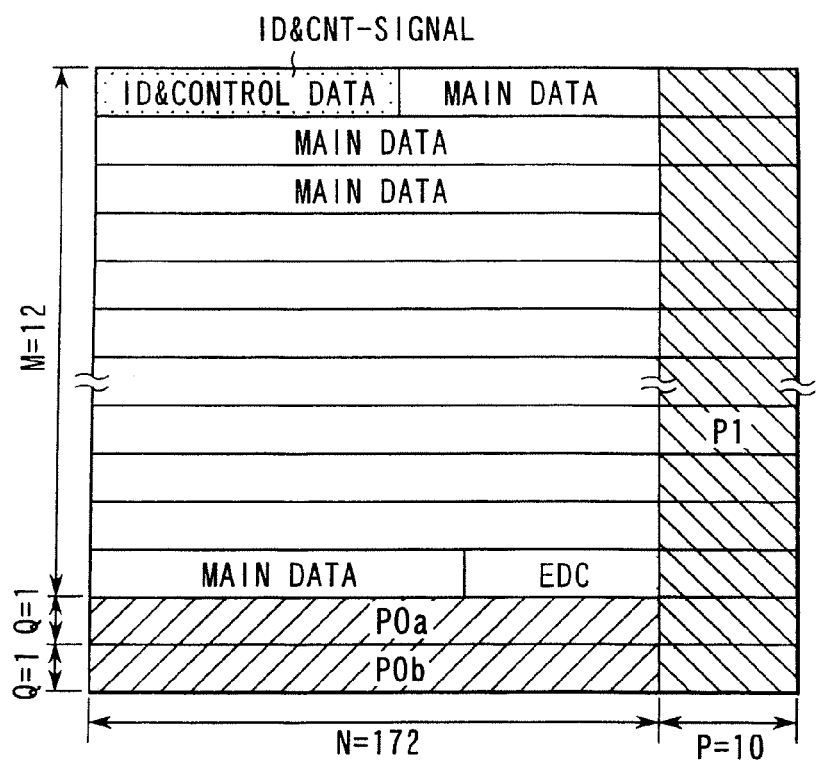
FIGS. 14A and 14B are views showing an example in which error-correcting words PO-a and PO-b are arranged on (M×N) bytes of information data block according to the present invention respectively.
Figure 14B:
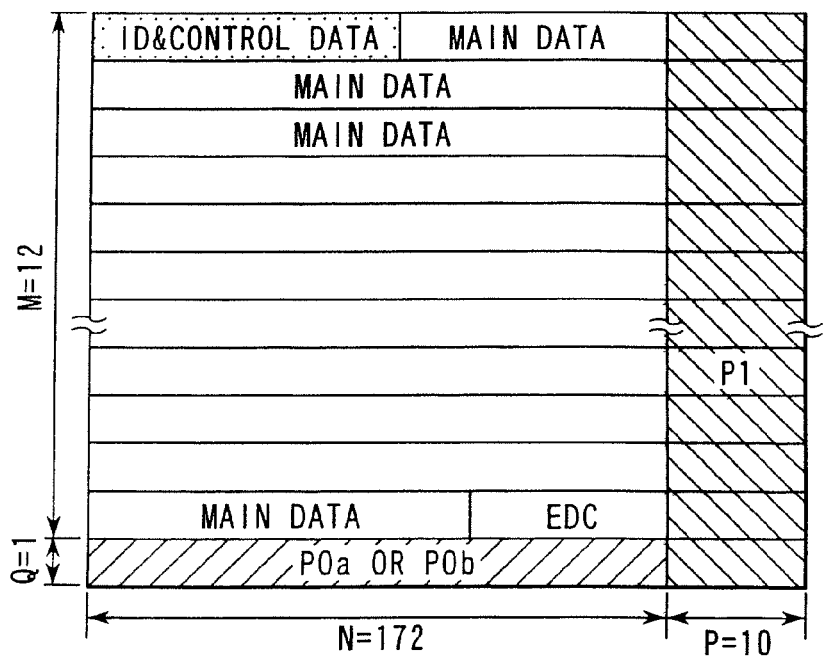

FIG. 14A is a view showing the state in which one information data block after the dispersion and arrangement of the PO in the case of PO-a=PO-b=(K×Q). Furthermore, FIG. 14B is a view showing the state in which one information data block is taken out after the dispersion and arrangement of PO in the case of PO-a=PO-b=((K/2)×Q).

The ECC blocks shown in FIG. 13 are recorded on a recording medium from the front recording sector in order. Furthermore, in the transmission system, the blocks are recorded from the front recording sector in order. On the reproducing side or the receiving side, the ECC blocks are incorporated into a buffer memory from the front thereof in order. In the case where the ECC blocks having a unit shown in FIG. 13 is restored to a form as shown in the even-number block B-10 shown in FIG. 12, the odd-number block B-11 in an error-correcting processing so that PO system error-correcting processing is carried out. As a consequence, even when a burst error is present at the step of ECC block, the error is scattered to the even-number block and the odd-number block, so that the error-correcting capability is raised.

Here, in the present invention, the following points are noted to further raise the error-correcting capability.

Figure 15:
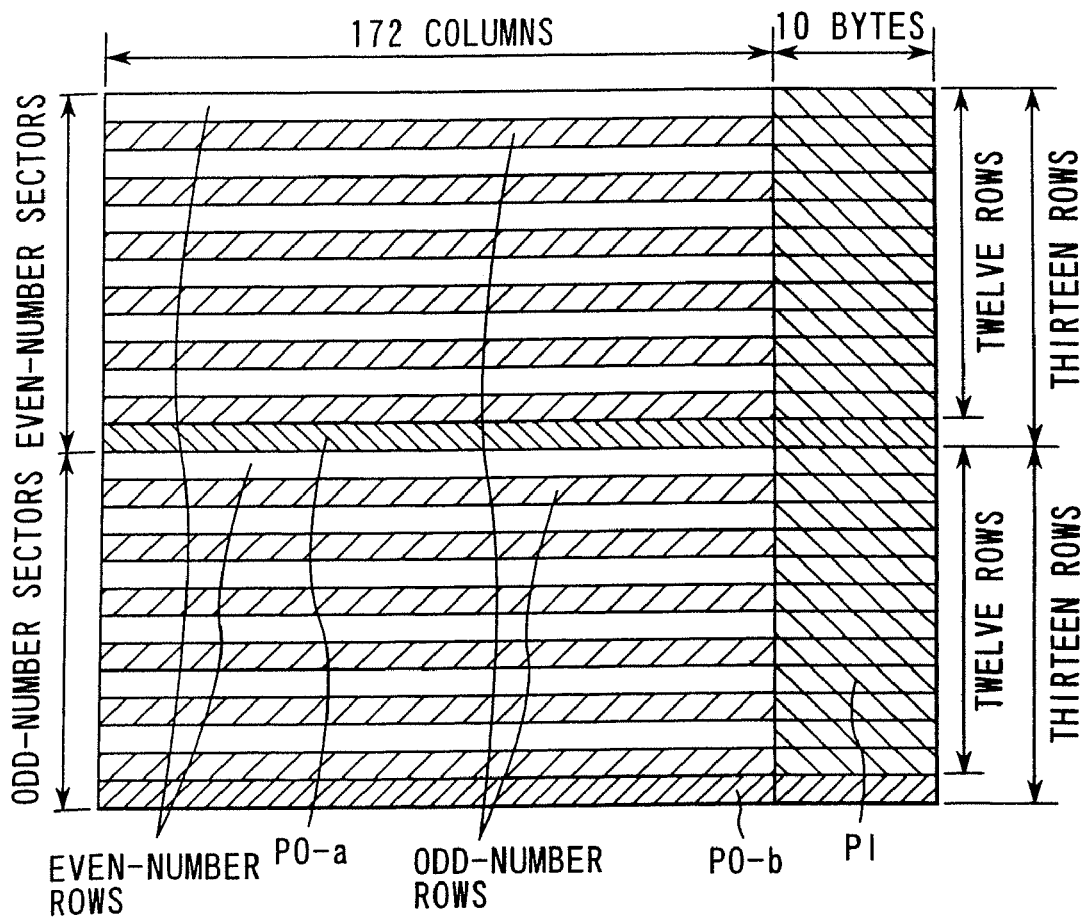
FIG. 15 is an explanatory view showing a sector link portion, the view being shown for explaining a problem at the time when an error-correcting block is structured with the method shown in FIG. 12.

FIG. 15 is A view shown for explaining noted point of the present invention.

In the above embodiment, the even-number row and the odd-number row of two set information data blocks are simply separated to create the PO series code (PO-a and PO-b) corresponding to the even-number block and the odd-number block. Next, the even-number block and the odd-number block are brought back to the arrangement (the state in which the even-number row and the odd-number row are alternately arranged), so that the PO series code as shown in FIG. 14A or FIG. 14B are scattered and arranged. This creates the ECC block as shown in FIG. 13.

Here, the PO series code is arranged by Q bytes between sectors. Here, a linkage between the sector (the even-number sector) and the sector (the odd-number sector) is noted (in this example, the sector includes 12 rows of information data block). Then, on the final row of the first sector, a part of PO-a created by using the even-number block (Q bytes (N+P)) is located and the front row of the second sector becomes an even-number row. Consequently, the front row of the second sector (the even-number row) is present in the even-number row.

As a consequence, as seen from the PO series, the PO series data is consecutively arranged for two row portions. An aim of the present invention is to create an arrangement of each row as a repetition of odd-numbers and even-numbers while the error-correcting word is created corresponding to the odd-numbers and the even-numbers respectively. As a consequence, when the errors are corrected, the even-number rows and the odd-number blocks are separated thereby enabling error correction processing in respective blocks. Consequently, the present invention is intended to scatter the error even at the time of the generation of the burst error to the ECC block to improve the error-correcting capability.

However, as has been explained in FIG. 15, when the same PO series data is arranged consecutively for two rows portion, the expected result of the error dispersion cannot be obtained at the time of the generation of the burst error at this portion.

Therefore, in the present invention which has been further improved, the previous even-number block and the odd-number block are not obtained, so that the following PO-a creation blocks and the PO-b creation blocks are obtained. That is, by referring to FIG. 16, the two blocks will be explained.

Figure 16:
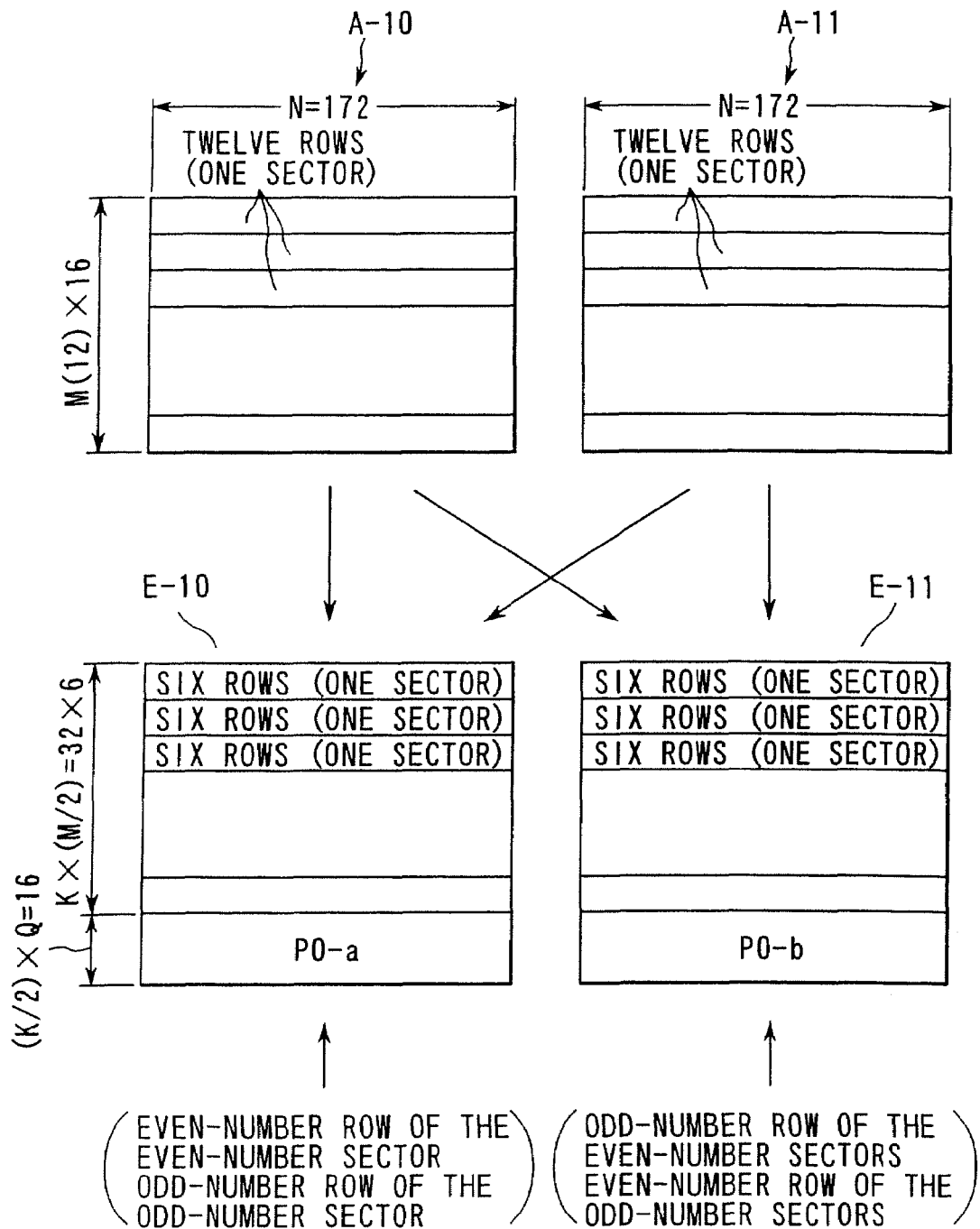
FIG. 16 is a view showing one example of a process at the time of creating the error-correcting block according to the present invention in the case where the error-correcting capability is further raised.

As shown in FIG. 16, using the two set information data block (A-10, A-11) which constitutes the data transmission order is the same as the previous example.

Here, in the PO-a creation block (E-10), the even-number row in the even-number sector and the odd-number row in the odd-number sector are aggregated and created from the two set information data blocks (A-10 and A-11). And in the PO-b creation block (E-11), the odd-number row in the even-number sector and the even-number row in the odd-number sector are aggregated and created from the two set information data blocks (A-10 and A-11).

Figure 17:
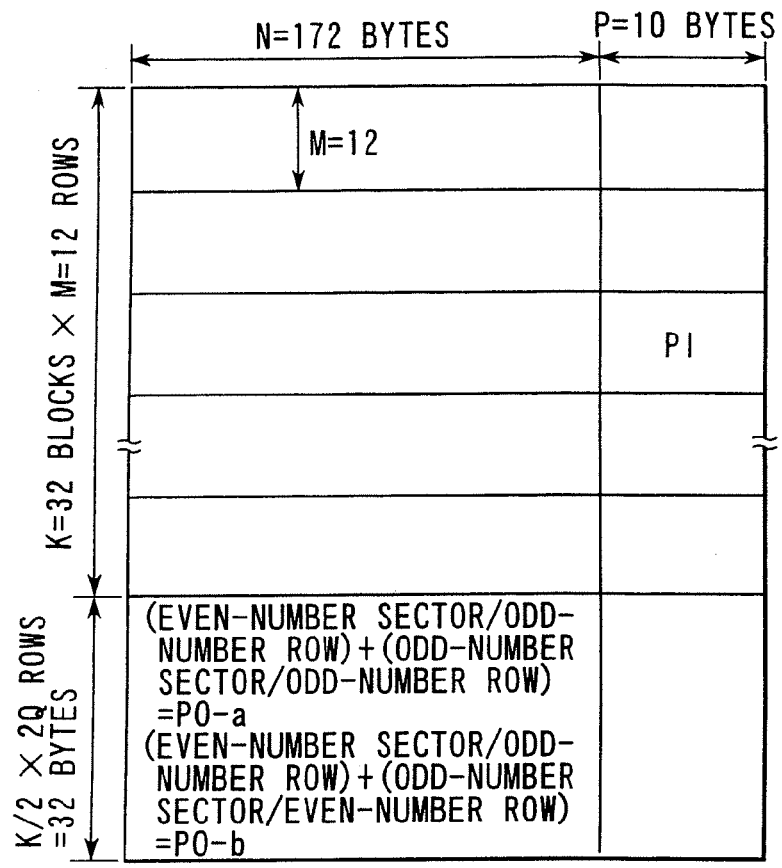
FIG. 17 is an explanatory view showing a block in the midst of the creation of the error-correcting block in which the error-correcting capability is improved.

FIG. 17 is a view showing the state in which the even-number row and the odd-number row of the above separated PO-a creation block (E-10) and PO-b creation block (E-11) are brought back to the original state and the even-number block and the odd-number block are linked in order. This block F is a set in which 32 information data blocks (N columns×N rows) are aggregated. Furthermore, as the outer parity, PO-a and PO-b are added thereto. Furthermore, the inner parity PI (10 bytes) is also added thereto. Next, the PO-a and PO-b created here is scattered and arranged in K(=32) (M×N) bytes information data blocks to information data blocks each having (M×N) bytes. As a consequence, between respective sectors, PO series code is arranged Q bytes.

Figure 18:
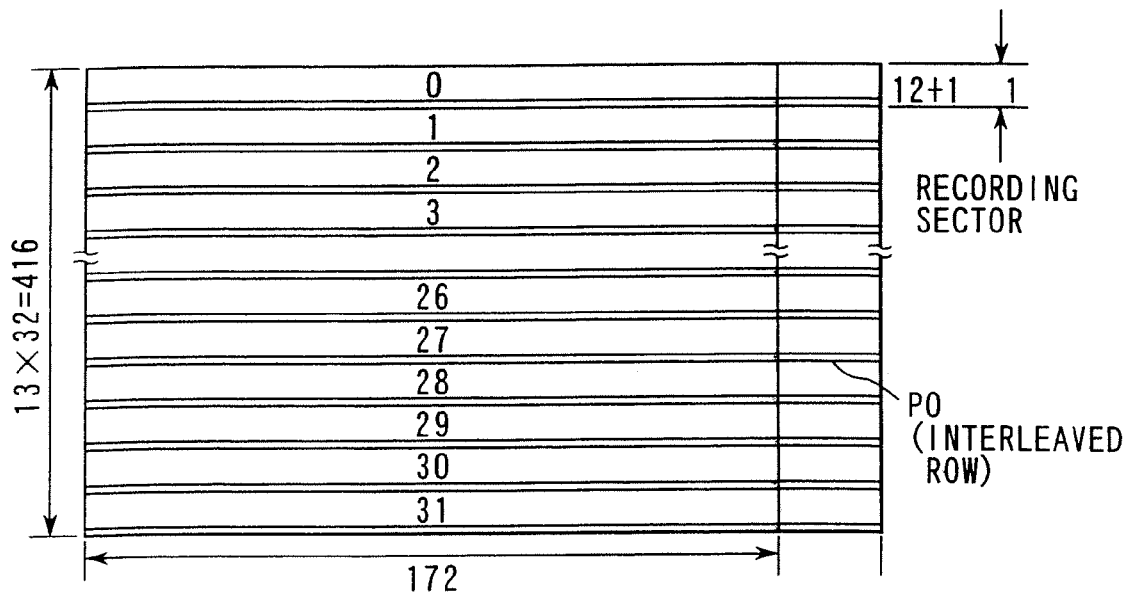
FIG. 18 is a view showing a state in which the error-correcting word PO is scattered and arranged on each information data block of the error-correcting block in which the error-correcting capability according to the present invention is improved.

FIG. 18 is a view showing the ECC block at this time. A method for scattering and arranging the PO series is explained in FIGS. 13, 14A and 14B.

Figure 19:
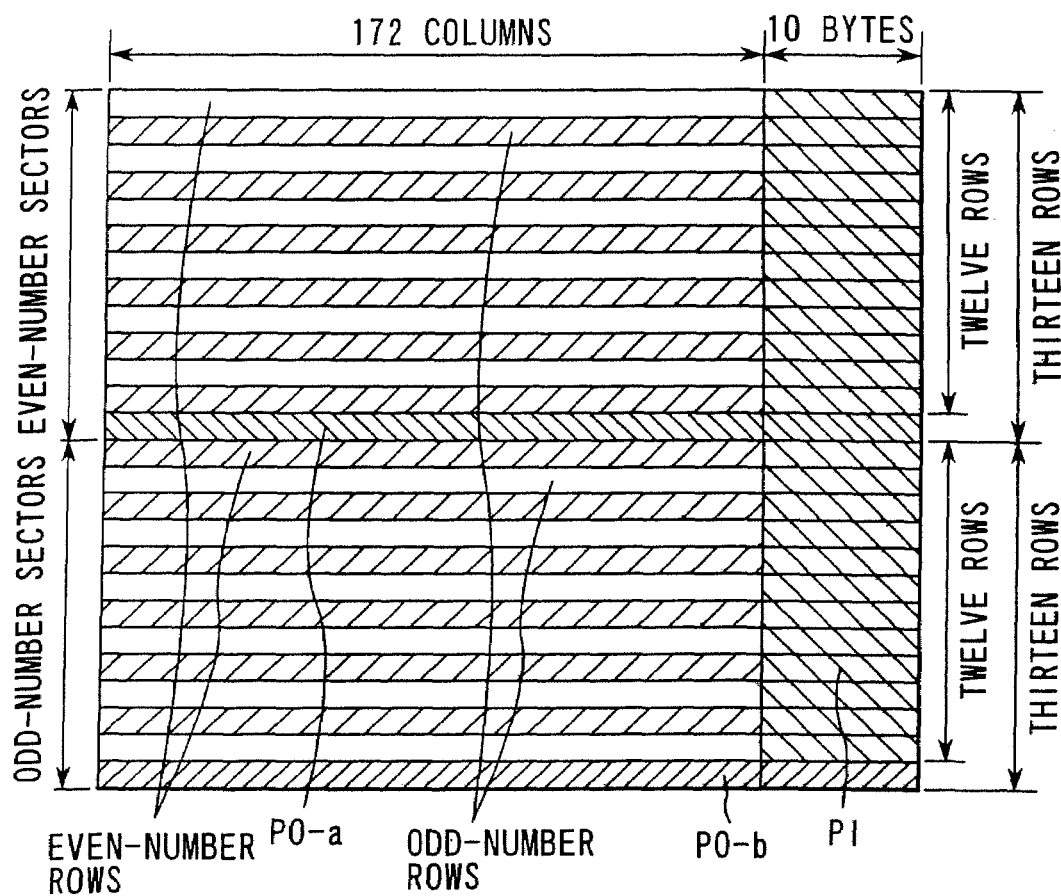
FIG. 19 is an explanatory view showing a sector link portion at the time when the error-correcting block is structured in a method shown in FIGS. 16 and 17.

FIG. 19 is a view in which a linkage between the sector (the even-number sector) and the sector (the odd-number sector) are noted in the ECC block. (In this example, the sector includes the 12 line information data blocks.) Then, at the last row of the first sector, a part (Q bytes×(N+P)) of the PO-a created by using the block E-10 is located at the last row of the first sector. The front row of the second sector is the even-number row, but the front row of the second sector is the PO-b series as explained in FIG. 16. As a consequence, the row at the linkage between the odd-number sector and the even-number sector is such that the row at the PO-a series and the row at the Po-b series are alternately arranged.

Consequently, the row at the PO-a series and the row at the Po-b series intended by the present invention are alternately arranged to form the ECC block with the result that an object of improving the error-correcting capability with respect to the burst error is effectively attained. That is, a burst error-correcting capability having a twice longer code length than the conventional method is provided by using the ECC blocks which are constituted in this manner.

In the above embodiment, there is shown a case in which the number of rows of one sector is M=12 (even number). Here, there is considered a case in which M is an odd number (for example, 11).

Now, in the same manner as the above embodiment, suppose that PO-a creation block (E-10), PO-b creation block (E-11) are created, and PO-a and PO-b are created with respect to the respective blocks. Then, each row of the PO-a creation block (E-10) and the PO-b creation block (E-11) are brought back to the original position. Furthermore, the PO-a and PO-b are scattered and arranged to create the ECC block.

Figure 20:
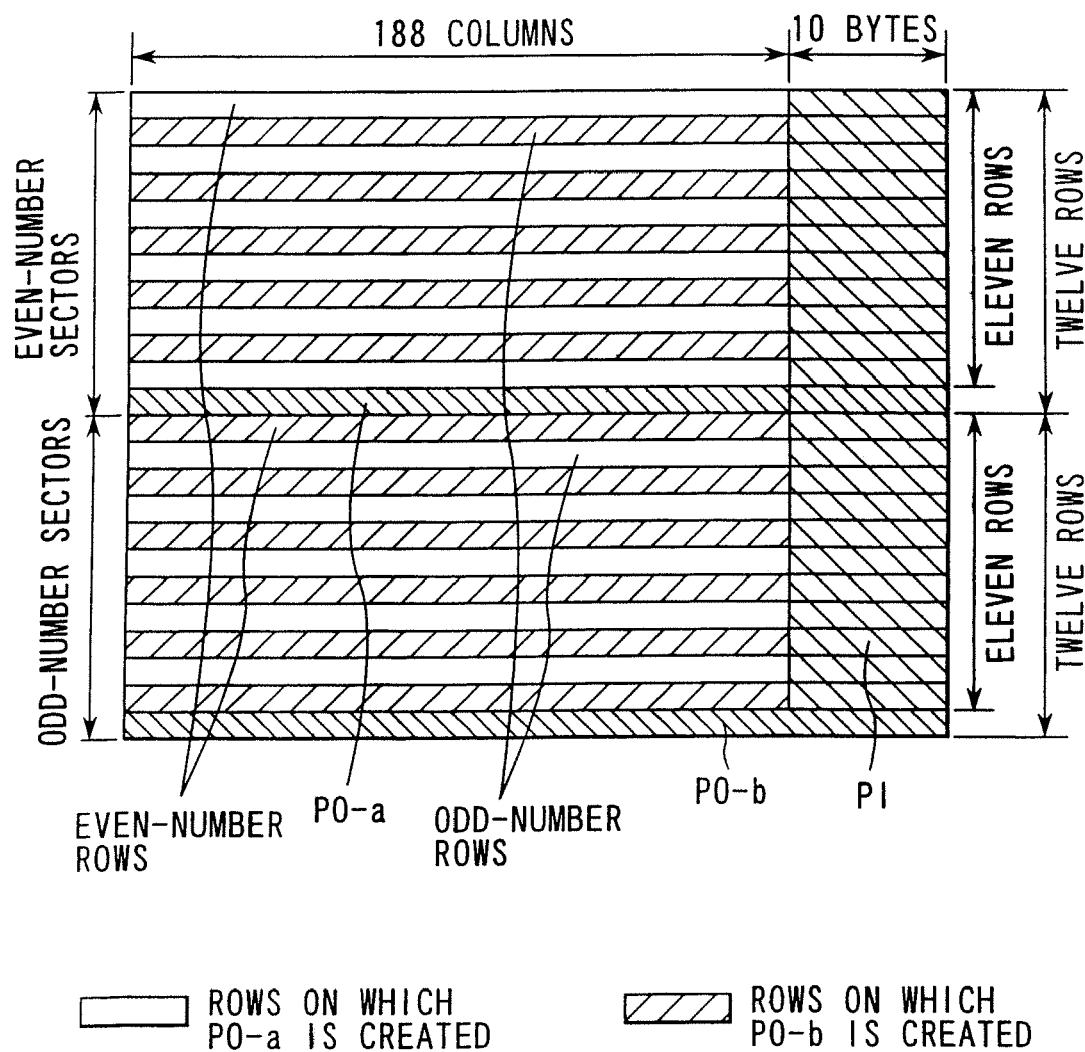
FIG. 20 is a view for explaining a sector link portion at the time when the error-correcting block is structured in a method shown in FIGS. 16 and 17 and an advantage of the present invention.

FIG. 20 is a view in which the linkage between the sector (even number sector) and the sector (odd number sector) in this ECC block is noted. (In this example, the sector includes 12 rows of information data blocks). Then, at the last row of the first sector, a part (Q bytes×(N+P)) of the PO-a block created by using the block E-10 created by using the block E-10 is located. The front row of the second sector becomes an even number block. The front row of the second sector is an even number block, the PO-b series row which belongs to the block E-11 is located as explained in FIG. 16.

As a consequence, the last row of the first sector and the row before the last row constitute the PO-a series row. Thus, in the case where a burst error is generated in this portion, the error-correcting capability cannot be sufficiently displayed. However, there is an example in which the effect of the present invention can be sufficiently obtained even when one of the sectors is an odd-number row.

Figure 21:
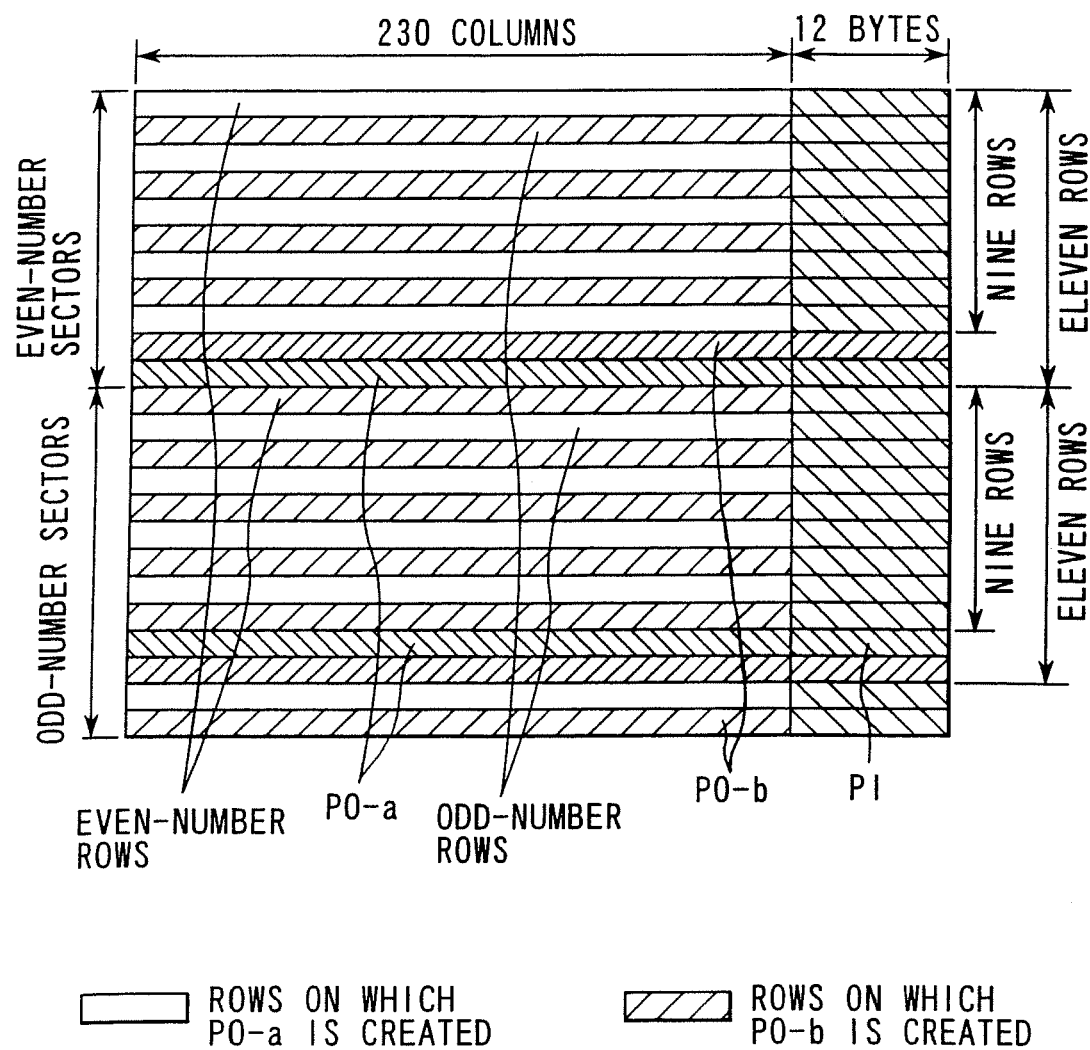
FIG. 21 is a view for explaining a sector link portion of the error-correcting block created in another embodiment of the present invention.

FIG. 21 is a view showing an example in which a method explained in FIG. 14A is adopted as a method for arranging the error-correcting code by adopting M=9 rows as a sector. In this example, on the linkage of the sector, the following row arrangement appears. In the beginning, look at the linkage at a portion where the odd-number sector is arranged next to the even-number sector. The last row as the even-number sector information data block is an even number, and PO-b series error-correcting code is added to the last row by one row.

Further, after this PO-b series error-correcting code, PO-a series error-correcting code is arranged by one row. Here, the front row of the odd-number sector is an even-number row. This even number is used to create PO-b series code as shown in the block E-11 of FIG. 16. Consequently, at the linkage portion of the even-number sector and the odd-number sector, PO-b and PO-a are alternately arranged.

Next, look at a linkage portion where the even-number sector is arranged next to the odd-number sector. The last row as the even-number sector information data block is an even number, and this row is separated into the block E-11 shown in FIG. 16. Therefore, the last row belongs to the PO-b series. To the contrary, PO-a series error-correcting code is added to the last row by one row. Next, after this PO-series error-correcting word, PO-b series error-correcting code is added by one row. The front row of the next even-number sector is an even number. The front row is separated into the block E-10 shown in FIG. 16. Therefore, the last row belongs to PO-a series. As a consequence, at the linkage of the odd-number sector and the even-number sector, rows of PO-b and PO-a series are alternately arranged.

That is, in the embodiment shown in FIG. 21, when the error-correcting words PO-a and PO-b are arranged, the selection order is devised so that the row of the PO-b, PO-a, PO-b and PO-a series are alternately arranged.

The concept of the embodiment of FIG. 21 can be applied to the case where one sector is the odd-number row (for example, M=10).

Figure 22:
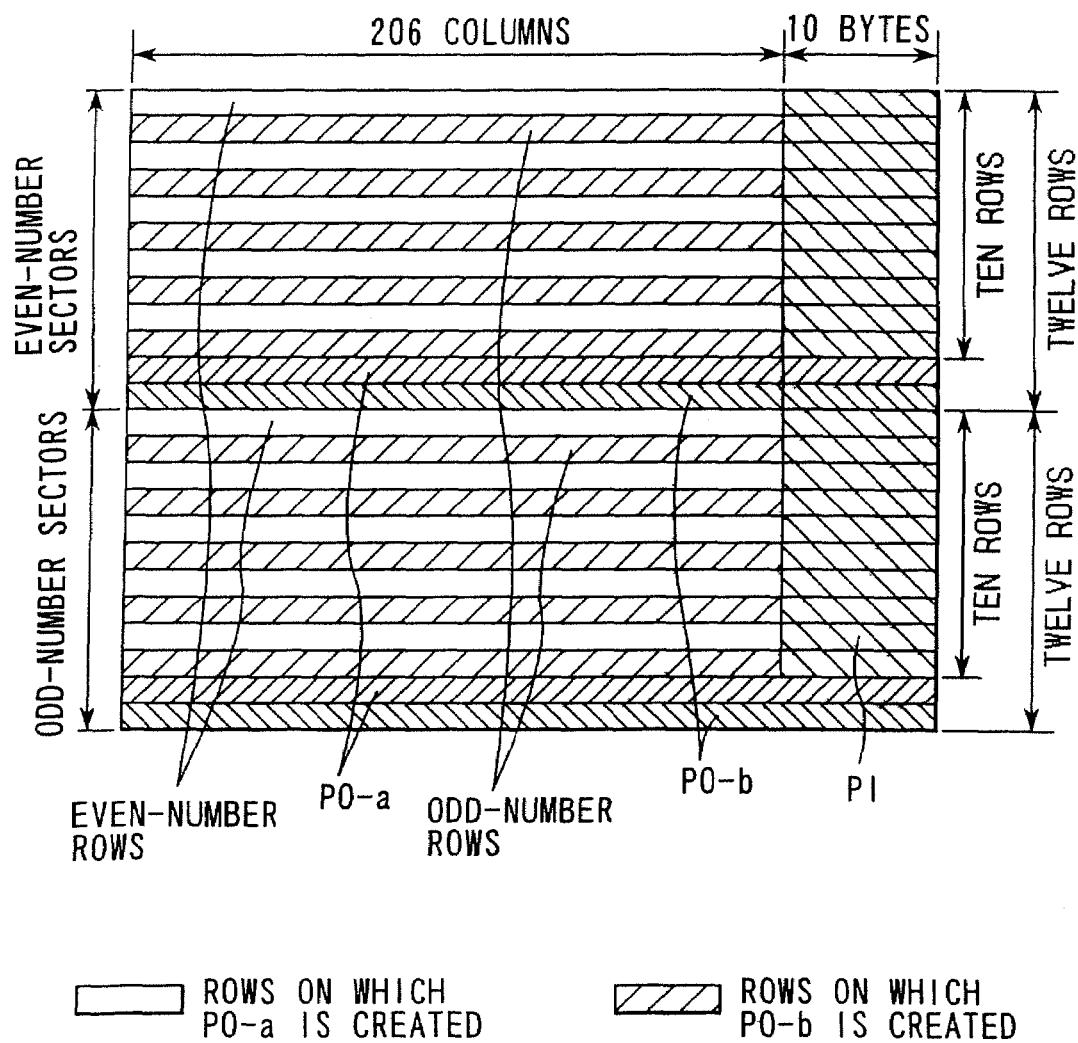
FIG. 22 is a view for explaining a sector link portion of the error-correcting block created in still another embodiment of the present invention.

FIG. 22 is an example in which one sector is an even-number (for example, M=10), and as a method for arranging the error-correcting method the method explained in FIG. 14A is adopted. Furthermore, in this example, the block E-10 of FIG. 16 comprises an even-number row of the even-number sector and an even-number row of the odd-number sector, and the block E-11 comprises an odd-number row of the even-number sector and an odd-number row of the odd-number sector.

In this embodiment, the linkage at the sector assumes the following row arrangement. The last row as the information data block of the even-number sector is the odd-number. This row is separated with the block E-11 of FIG. 16. Consequently, the last row belongs to the PO-b series. In contrast, the PO-a series error-correcting code is added by one row to the last row. Next, after the PO-a series error-correcting code, PO-b series error-correcting code is arranged by one row. The front row of the next odd-number sector is an even-number. In this case, the front row belongs to the PO-a series. As a consequence, at the linkage portion of the odd-number sector and the even-number sector, rows of the PO-a, PO-b, and PO-a are alternately arranged.

Figure 23:
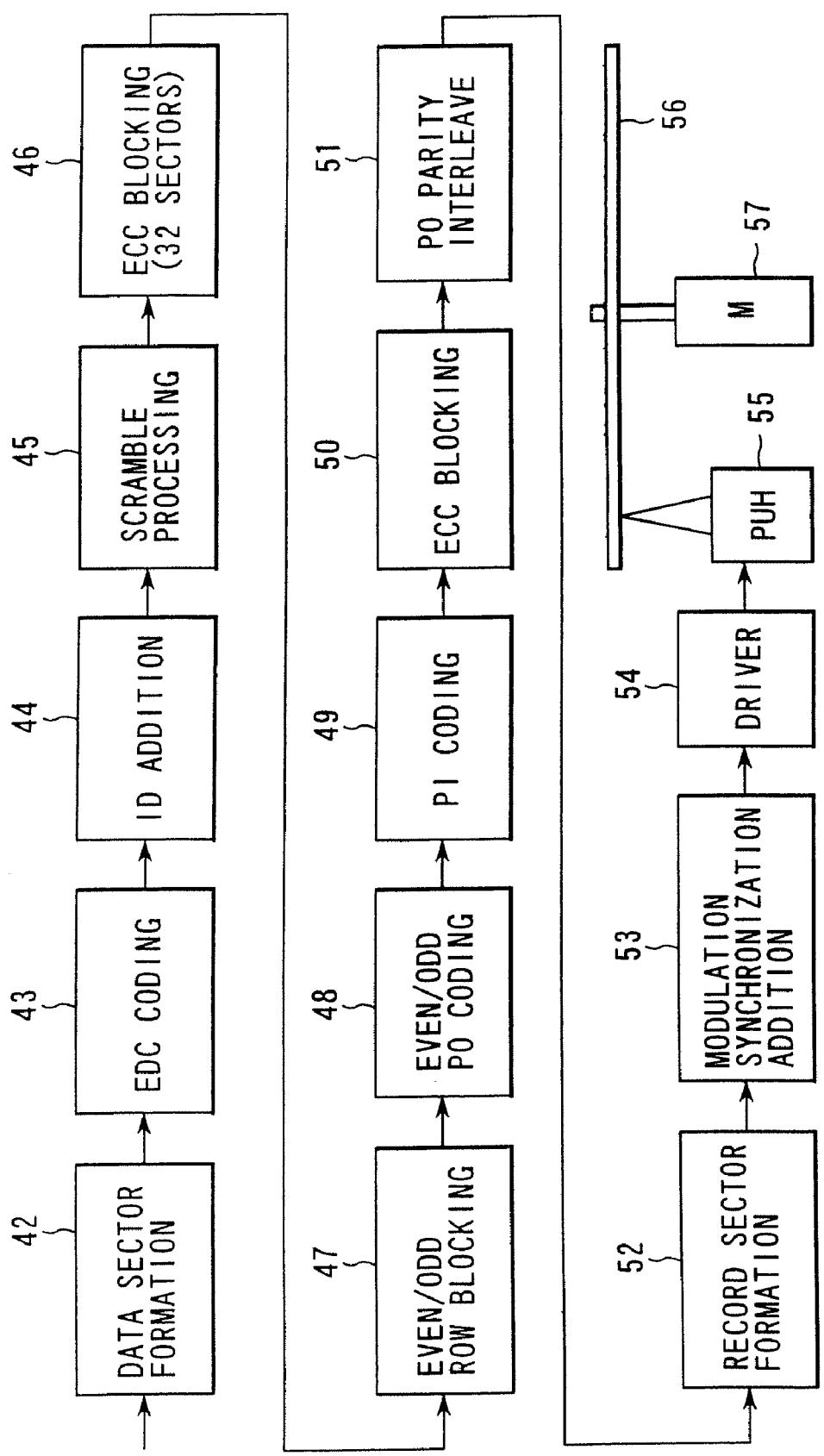
FIG. 23 is an explanatory view showing a process of creating an ECC block and a recording medium according to the present invention.

FIG. 23 is a view showing a data processing procedure of a recording apparatus to which the present invention is applied. Data for recording is input to the data sector portion 42 from the outside to be sectored. In this embodiment, 2K bytes constitute the basic unit. An error sensing code (EDC) is added to the data block having a 2K bytes unit data block. This data block is referred to as information data block. This processing is carried out at the EDC coding portion 43. Next, the ID for identifying the information data block (sector) and other control signal is added to the ID adding portion 44. Next, at the scramble processing portion 45, the main information data is scramble processed.

This scramble processing is carried out for the following reasons. That is, in the case where the main data is an image signal or the like, "0" continuously appears in the blank portion. When such signal is handled as a recording signal, there appears a tendency that the recording signal becomes a repetition of the same pattern. When the same pattern of the recording medium is present on the adjacent track such as an optical disk or the like, the operation of the servo becomes unstable under the influence of the cross talk between tracks. In order to prevent this, the scramble pattern determined by ID is used, so that data scramble is provided by overlapping the scramble data onto the data.

The scrambled data (sector) is summarized in 32 sector units in the transmission order so that the data is ECC blocked in the ECC block portion 46. This ECC block is input to the even-number/odd-number block portion 47. Here, the even number and the odd number are temporarily blocked separately. Then, at the even-number and odd-number PO coding portion, each block is subjected to the PO series error-correcting word as explained in the previous embodiment.

Next, at the PI coding portion, each row is subjected to PI series error-correcting coding process. Next, at the ECC blocking portion 50, the block of the even-number row and the block of the odd-number are integrated. Furthermore, at the PO parity interleave portion 51, the PO series parity is scattered to each sector while the PO series inspection and correcting word is interleaved to each data sector in the whole block.

Next, this ECC block is input to the recording sector portion 52. Furthermore, when a synchronizing signal is added with the recording sector portion 52 and the next modulation and synchronizing addition portion 53, and is 8/16 modulated. This modulation signal is supplied to an optical pickup 55 to drive a laser diode. As a consequence, the laser light is applied to the disc to record the signal. The disk 56 is rotated and controlled with the disk motor 57.

Figure 24:
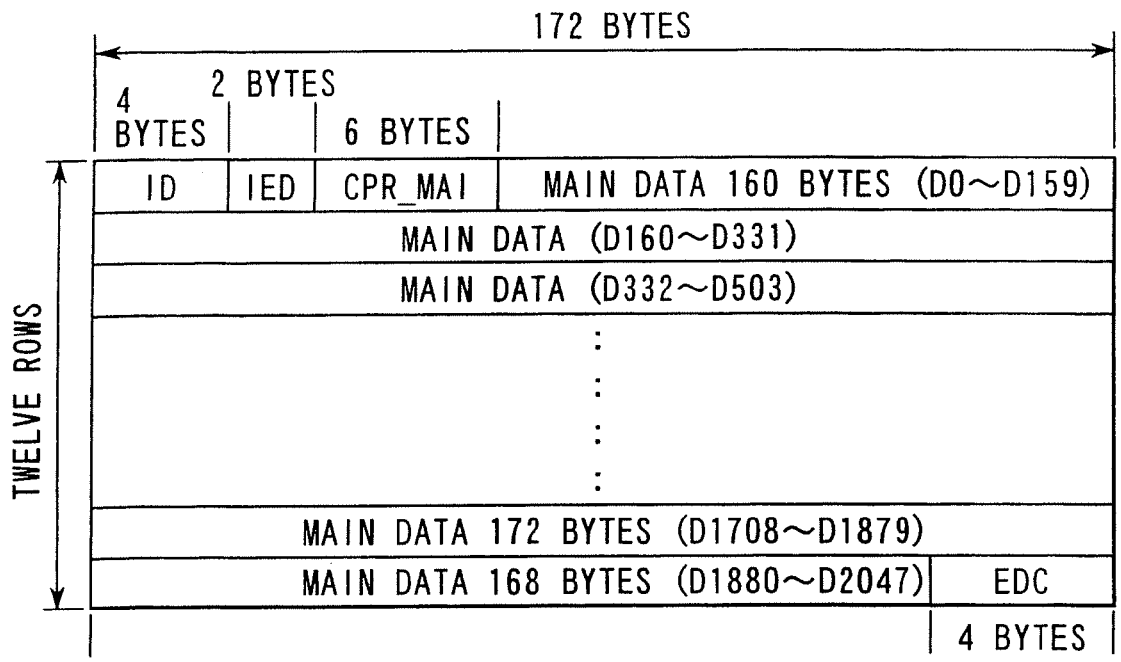
FIG. 24 is an explanatory view showing a structure of a data sector in the DVD.

FIG. 24 is a view showing a structure of a data sector in the DVD format created in the midst of the above recording processing. The data sector has 172 columns (172 bytes) and 12 rows. The first row is composed of an ID (4 bytes), an IED (ID error-detecting code: 2 bytes), a CPR-MAI (copyright management information: 6 bytes), and a 160 bytes of main data. At the end of the last row (12th row), main data and four bytes of error-detecting code are added thereto. The remaining row are all main data.

Figure 25:
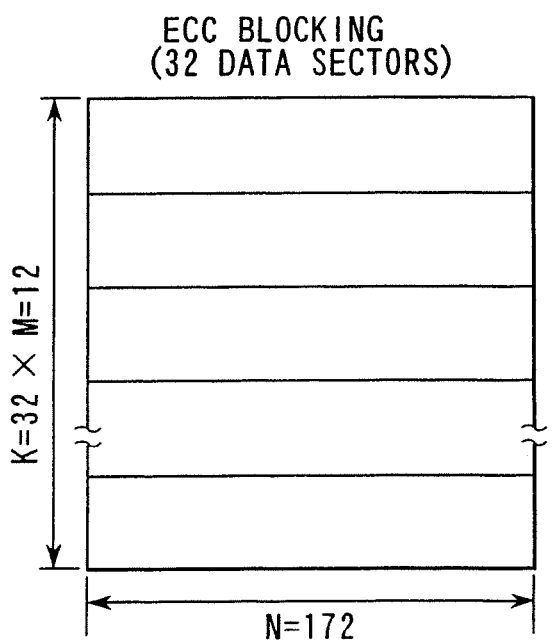
FIG. 25 is an explanatory view showing a state in which the sector according to the present invention is blocked into ECC blocks.

FIG. 25 is a view showing a state in which 32 sectors are aggregated to form an ECC block as has been described above.

Figure 26:
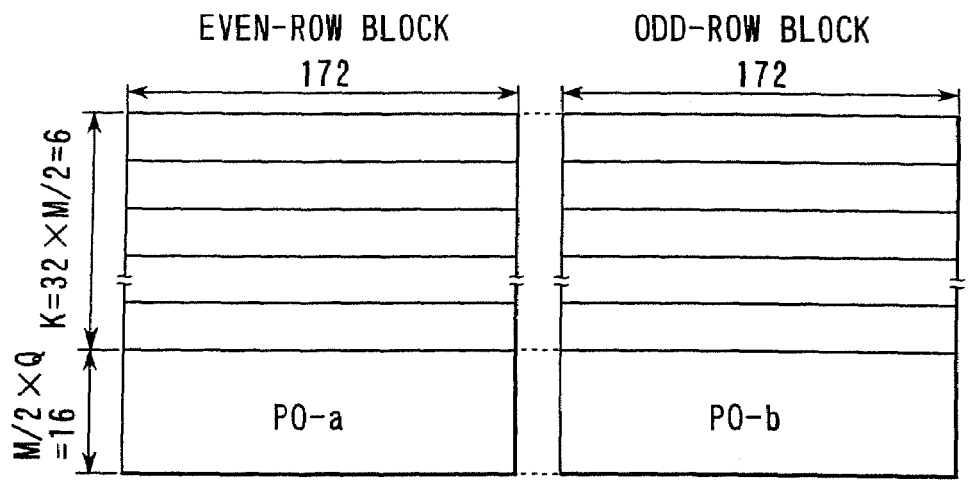
FIG. 26 is an explanatory view showing a state in which the ECC block is divided into to two divided blocks which observes the rule of the present invention so that a PO series error-correcting word is added to each of the divided blocks.

FIG. 26 is a view showing the state in which the ECC block is divided with the rule explained in FIG. 12 or FIG. 16 to constitute an even-number block (or PO-a creation block) and an odd-number block (or PO-b creation block) so that the PO series codes PO-a and PO-b are created and added with respect to respective blocks.

Figure 27:
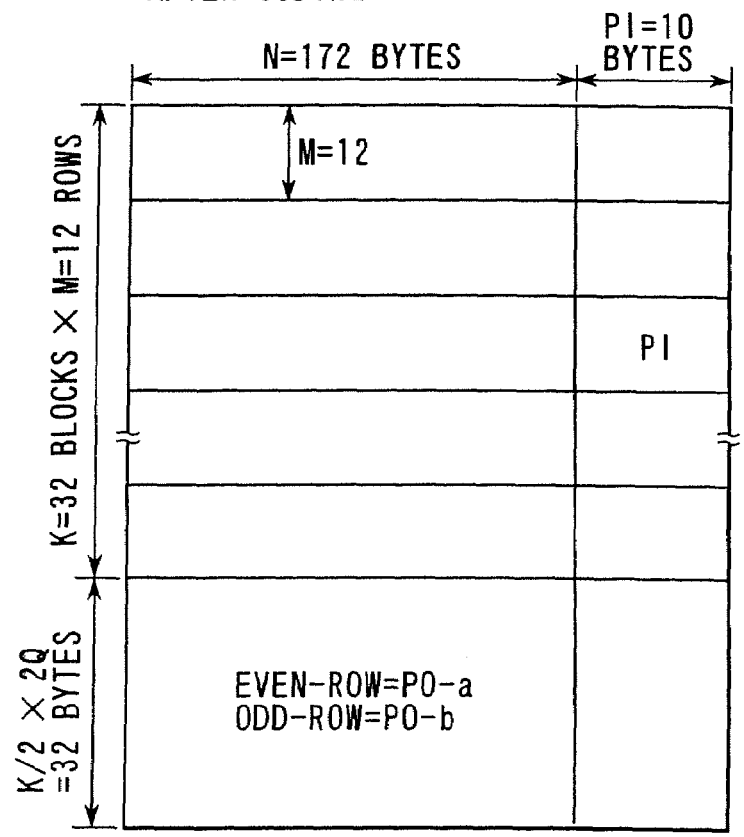
FIG. 27 is a view showing a state in which the two divided blocks which observes the rule of the present invention shown in FIG. 15 are integrated so that PI series error-correcting word is added to the two divided blocks.

FIG. 27 is a view showing the state of a single ECC block in which the even-number block (or the PO-a creation block) and the odd-number block (or the PO-b creation block) are integrated together with the code PO-a and PO-b. Furthermore, FIG. 27 shows a state in which the PO-a code are created and added. The arrangement order of the PO-a and the PO-b are not limited to what is shown in the drawings.

Figure 28:
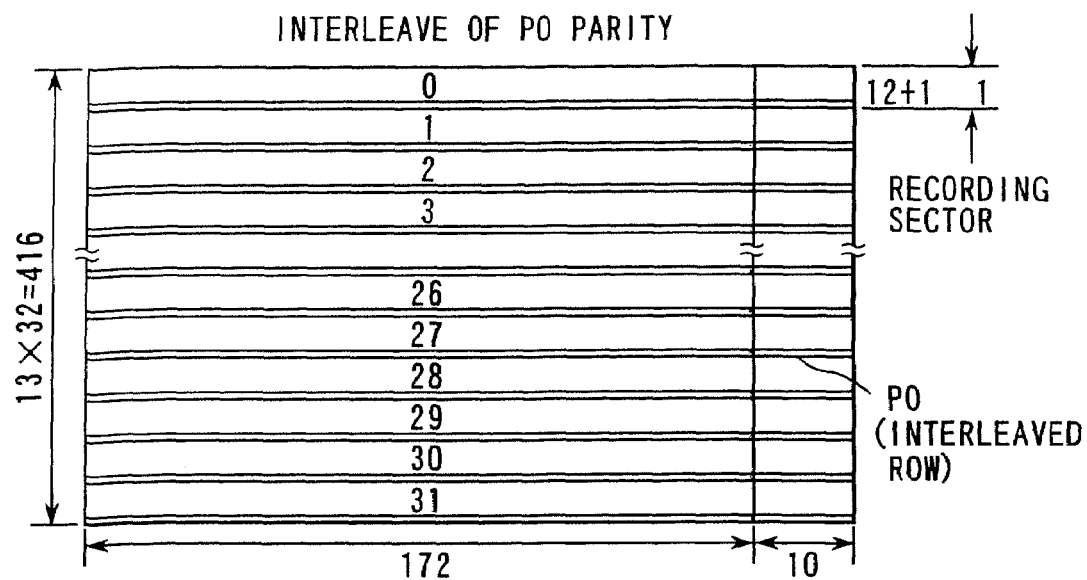
FIG. 28 is an explanatory view showing a state in which the PO series code is interleaved in the ECC block.

FIG. 28 is a view showing a state in which the PO series code is scattered to each sector. This is the recording sector. To each recording sector, a synchronizing signal is added and further modified to be recorded on the recording medium.

Incidentally, according to the present invention, the PO series error-correcting word is created and the PI series error-correcting word is created in the above explanation. However, this processing procedure is not limited thereto. This processing order may be the contrary. That is, after the data sector is ECC blocked, the PI series error-correcting code is created so that the ECC blocks to which the PI code is added is separated into a block in which the even-number row of the ECC block added with the PI code is aggregated and the block in which the odd-number row is aggregated. Thereafter, the PO series error-correcting word including the PI code may be created. Then, after that, the even-number row and the odd-number row are re-aggregated so that, after that, the PO code may be distributed in the interleave processing.

Figure 29:
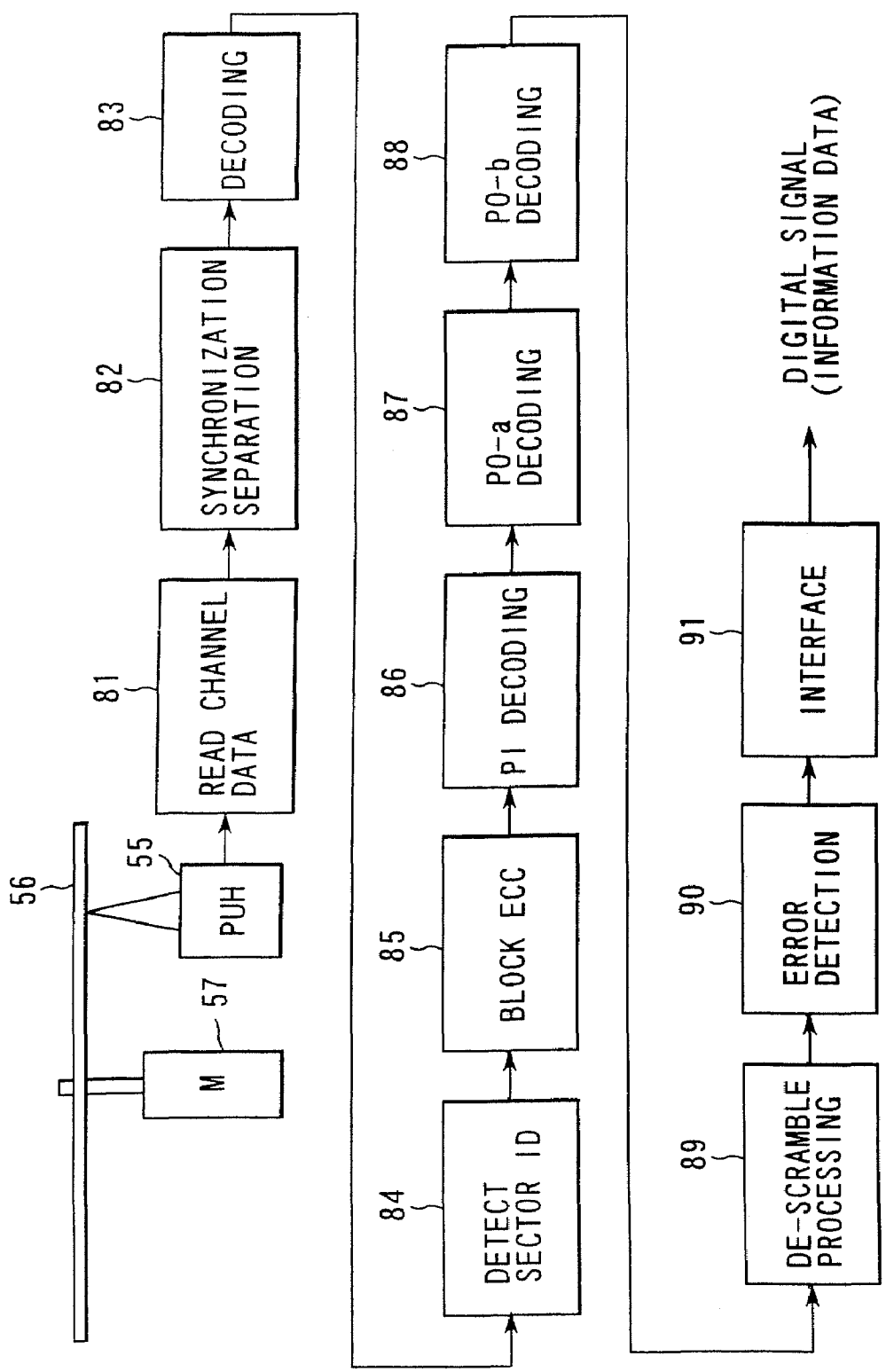
FIG. 29 is a view showing a reproduction processing apparatus of the ECC block according to the present invention.

FIG. 29 is a view showing an example of a structure of a reproducing apparatus to which the basic concept of the present invention is applied.

On the disc 56, data is recorded with a recording method as previously explained. A modification signal read with the pickup head 55 is supplied to the channel data reading portion 81 to provide a channel bit unit. Then at the synchronizing separation portion 82, the synchronizing signal is separated and divided in symbol units. Next, at the decoding portion 83, the signal is decoded from 16-bit data to 8-bit data to be supplied to the sector ID detection portion 84. Here, the data is identified and aggregated for each of the sectors to be input into the ECC block creation portion 85. Here, the sectors are aggregated to provide an EEC block unit data. The ECC block is input to the PI decoding portion 86 to carry out the PI series error sensing and correcting. Next, at the PO-a decoding portion 87, the PO-a error detection and correction is carried out so that the PO-b series error detection and correction is carried out at the PO-b series decoding portion 88.

Next, the de-scrambling of the main data portion is conducted at the de-scramble processing portion 89. Furthermore, at the error-detecting portion 90, errors in the main data portion are detected on the basis of the EDC so that a normal data is taken out. This main data is transmitted to the processing portion after that via the interface.

Incidentally, at the reproduction processing, either the PI series error detection and correction processing or the PO series error detection and correction processing may be carried out prior to the rest of the two. The order is not restricted to what is shown in the drawings.

By the way, in the DVD, a video object (VOB) is designated in cells, and VOB is a format in which a plurality of video object units (VOBU) are included. The video objects allow the inclusion of a plurality of video packets (V_PCK), audio packets (A_PCK), and subsidiary image packets (SP_PCK). Furthermore, in the recording reproduction format, a control packets (RDI_PCK) including the real-time data information (RDI) arranged at the front of the VOBU. On this packet, such information as the reproduction start-time, intermission information at the recording time, display control information (aspect ratio information), copy control information or the like. Furthermore, in this packet, a reservation area is also secured.

Furthermore, the video data incorporated in the V_PCK is subjected to compression by means of MPEG1 or MPEG2 method. Either in the MPEG 1 or MPEG 2 method, information showing an aspect ratio or the like is described on a sequence head or the like. Furthermore, the GOP user data for the line 21 can be inserted into a part of the compressed data. This part is used at the time of sending a character code data.

Furthermore, in the DVD standard which can be recorded and reproduced, a control data area is also secured for describing program chain information for determining the reproduction order of the program recorded on the user data area.

Consequently, in the case where the ECC block of the present invention is used, an area of a portion of RDI_PCK, or an arrangement portion of the GOP user data or a portion of the control data area are used to store ECC block identification information showing what form the ECC block form assumes.

When this ECC block identification information is stored, it is possible to identify which form of the ECC block the recorded information or the transmitted information is. As a consequence, the present invention can be added and provided on the conventional DVD reproducing apparatus so that the present invention can be widely applied. It goes without saying that a circuit may be arranged in parallel which processes data in the conventional ECC block forms on the previous recording and reproducing apparatus with the result that the user can adopt any process form at the time of recording data. In this case, in accordance with the ECC block form selected at the time of recording the above ECC block identification information is automatically prepared so that the information is stored and arranged in a predetermined area.

A method for creating the PI series error-correcting code (or form) according to the present invention is not limited to the above embodiment.

Figure 30:
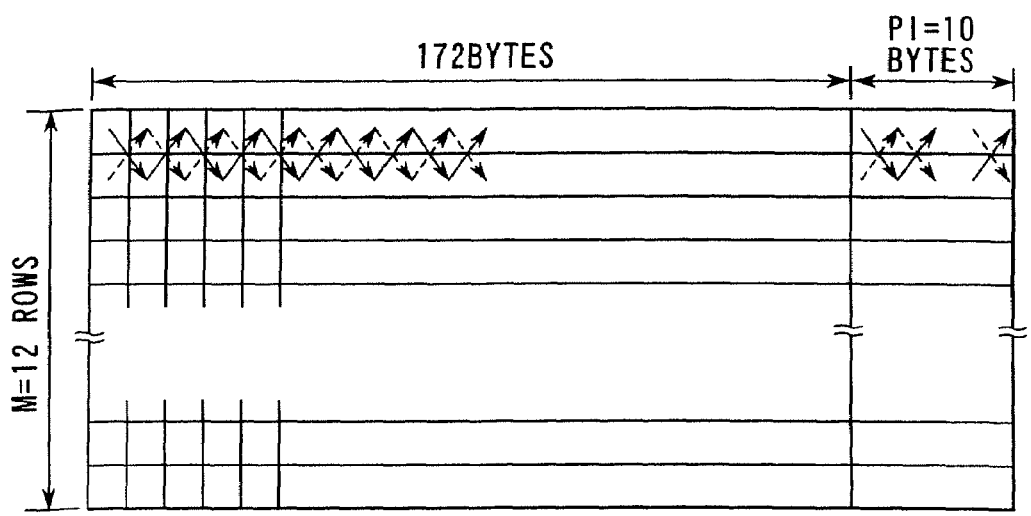
FIG. 30 is a view showing another embodiment of a method for creating a PI series error-correcting word of ECC block according to the present invention.

FIG. 30 is a view showing another method for creating the PI series error-correcting word. In this example, there is shown a method for creating 10 bytes code using these selected data by alternately selecting two-rows data every two columns. When the number of rows is the even number, the PI series correcting capability can be heightened even when a part of one row data is damaged.

Furthermore, although the above explanation is centered upon the recording of the ECC block structure according to the present invention on the recording medium, the present invention is not limited to the processing method and apparatus at the time of recording data on the recording medium. In the communication apparatus as well, data is formed into packets so that data sectors are created. These data sector may be aggregated and subjected to modulation and is transmitted. In this case, it goes without saying that the form of the present invention may be adopted as the ECC block form in which the data sectors are aggregated. Furthermore, with respect to the modulation process method, the present invention is not limited to the above explanation. The data of the ECC block is modulated with the QPSK method, the QAK method or the like. Furthermore, in the transmission channel, data may be sent by using the OFDM method.

Furthermore, in the above embodiment, a predetermined unit of the sector set block is divided into the even number block and the odd-number block so that an error-correcting words PO-a and PO-b are created. The error-correcting word may be is divided into two or more (Y) to create the error-correcting word thereby constituting the PO series.

As has been explained above, when the present invention is used, the burst error-correcting capability can be largely improved with the redundant flag ratio which is the same as the conventional ratio in the error-correcting method based on the byte data. Then, according to the present invention, the error-correcting process at an optical disk with a high density using a blue laser the development of which has just started can be realized to a physical error length larger than the conventional one.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording method for recording information on a recording medium, the recording medium being able to have error correction code (ECC) blocks arranged on a track, the ECC blocks being obtained by using a plurality of sectors configured to include information, the information recording method comprising:
   creating a first PO creation block corresponding to one of the ECC blocks, the first PO creation block being configured by rows in the plurality of sectors;
   creating a second PO creation block corresponding to an other one of the ECC blocks, the second PO creation block being configured by rows in the plurality of sectors;
   creating a first PO into the first PO creation block and each row of the first PO being interleaved into the first PO creation block; and
   creating a second PO into the second PO creation block, and each row of the second PO being interleaved into the second PO creation block,
   wherein each of the leading rows of sectors in the first and second PO creation blocks has an ID including address information.

2. An information reproducing method for reproducing information from a recording medium, the recording medium being able to have error correction code (ECC) blocks arranged on a track, the ECC blocks being obtained by using a plurality of sectors configured to include information, one of the ECC blocks being created by a first PO creation block, the first PO creation block being configured by rows in the plurality of sectors, an other one of the ECC blocks being created by a second PO creation block, the second PO creation block being configured by rows in the plurality of sectors, a first PO created into the first PO creation block and each row of the first PO being interleaved into the first PO creation block, and a second PO created into the second PO creation block, and each row of the second PO being interleaved into the second PO creation block, wherein each of the leading rows of sectors in the first and second PO creation blocks has an ID including address information, the information reproducing method comprising:
   reading the ECC blocks from the medium; and
   decoding the first and second PO creation blocks.

3. An information reproducing apparatus for reproducing information from a recording medium, the recording medium being able to have error correction code (ECC) blocks arranged on the track, the ECC blocks being obtained by using a plurality of sectors configured to include information, one of the ECC blocks being created by a first PO creation block, the first PO creation block being configured by rows in the plurality of sectors, an other one of the ECC blocks being created by a second PO creation block, the second PO creation block being configured by rows in the plurality of sectors, a first PO created into the first PO creation block and each row of the first PO being interleaved into the first PO creation block, and a second PO created into the second PO creation block, and each row of the second PO being interleaved into the second PO creation block, wherein each of the leading rows of sectors in the first and second PO creation blocks has an ID including address information, the information reproducing apparatus comprising:
   a read block which reads the ECC blocks from the medium; and
   a decode block which decodes the first and second PO creation blocks.

* * * * *